United States Patent
Bernard et al.

(10) Patent No.: US 12,199,541 B2
(45) Date of Patent: Jan. 14, 2025

(54) SYSTEMS AND METHODS FOR ELECTRIC DAMPING OF AIRCRAFT FLIGHT CONTROL SURFACES AND PROPELLERS

(71) Applicant: Archer Aviation, Inc., San Jose, CA (US)

(72) Inventors: Guy Bernard, Kirkland (CA); Geoffrey Bower, Sunnyvale, CA (US); Diederik Marius, Sunnyvale, CA (US); Kurt Wagner, Los Gatos, CA (US); Stephen Spiteri, Livermore, CA (US)

(73) Assignee: ARCHER AVIATION INC., San Jose, CA (US)

( * ) Notice: Subject to any disclaimer, the term of this patent is extended or adjusted under 35 U.S.C. 154(b) by 0 days.

(21) Appl. No.: 18/401,446

(22) Filed: Dec. 30, 2023

(65) Prior Publication Data

US 2024/0348190 A1    Oct. 17, 2024

Related U.S. Application Data

(60) Provisional application No. 63/459,324, filed on Apr. 14, 2023.

(51) Int. Cl.
*H02P 29/00* (2016.01)
*B64C 11/00* (2006.01)
*B64D 31/02* (2006.01)
*H03K 17/56* (2006.01)

(52) U.S. Cl.
CPC .............. *H02P 29/00* (2013.01); *B64C 11/00* (2013.01); *B64D 31/02* (2013.01); *H03K 17/56* (2013.01)

(58) Field of Classification Search
CPC ......... H02P 29/00; B64C 11/00; B64D 31/02; H03K 17/56

USPC .................. 318/400.34, 400.32, 400.01, 700
See application file for complete search history.

(56) References Cited

U.S. PATENT DOCUMENTS

| | | | |
|---|---|---|---|
| 8,154,228 B2 * | 4/2012 | Yundt | H02P 21/36 318/432 |
| 9,515,581 B2 * | 12/2016 | Ogawa | H02P 6/085 |
| 9,889,990 B2 * | 2/2018 | Dimitrov | B65G 13/06 |
| 2017/0260872 A1 | 9/2017 | Munevar | |

(Continued)

FOREIGN PATENT DOCUMENTS

WO     2010033101 A1     3/2010

OTHER PUBLICATIONS

International Search Report and Written Opinion for PCT Application No. PCT/US2024/022333, dated Sep. 11, 2024, 19 pages.

*Primary Examiner* — David Luo
(74) *Attorney, Agent, or Firm* — Finnegan, Henderson, Farabow, Garret & Dunner, LLP

(57) ABSTRACT

An aircraft system for damping movement of a structural flight element. The aircraft system including a moveable aircraft structure, a power source, a controller, a resistor, and a first transistor connected in series to the resistor. When the power source of the aircraft is providing power, the controller controls the first transistor to prevent current flow through its terminals and through the resistor. Further, when the power source of the aircraft is not providing power, the first transistor allows current generated by a back EMF (electromotive force) voltage to flow through its terminals and through the resistor, the back EMF voltage being created by movement of the moveable aircraft structure.

75 Claims, 10 Drawing Sheets

(56) References Cited

U.S. PATENT DOCUMENTS

| | | |
|---|---|---|
| 2022/0009616 A1* | 1/2022 | Galvão .................. B64C 13/04 |
| 2022/0094297 A1 | 3/2022 | Lacaux et al. |
| 2022/0200503 A1 | 6/2022 | Popek et al. |

* cited by examiner

SYSTEMS AND METHODS FOR ELECTRIC DAMPING OF AIRCRAFT FLIGHT CONTROL SURFACES AND PROPELLERS

CROSS-REFERENCE TO RELATED APPLICATIONS

This disclosure claims priority to and the benefit of U.S. Provisional Application No. 63/459,324, filed Apr. 14, 2023, titled "Systems and Methods for Electric Damping of Aircraft Flight Control Surfaces and Propellers", the contents of which is incorporated herein in its entirety and for all purposes.

TECHNICAL FIELD

This disclosure relates generally to the field of powered aerial vehicles. More particularly, and without limitation, the present disclosure relates to innovations in tilt-rotor aircraft that use electrical propulsion systems. Certain aspects of the present disclosure generally relate to electrically damping motor-controlled aircraft flight elements. Further, certain aspects of the present disclosure relate to a motor control system and associated circuitry that uses back EMF (electromotive force) voltage created by moving flight elements to generate a counter-torque opposing the movement.

SUMMARY

Embodiments of the present disclosure provide a system that dampens movement of an aircraft flight element. As used herein, an aircraft flight element may refer to one or more moveable structural components of an aircraft, such as flight control surfaces (e.g., ailerons, elevators, rudders etc.), rotors, proprotors, and/or propellers.

One aspect of the present disclosure is directed to an electrical system for an aircraft including a controller, resistor, and a switching device connected in series to the first resistor. The controller is configured to control the switching device to prevent current flow through the first resistor when a power source of the aircraft is providing power. The switching device is configured to allow current generated by a back EMF (electromotive force) voltage to flow through the first resistor when the power source of the aircraft is not providing power, the back EMF voltage being created by movement of a moveable aircraft structure of the aircraft.

BRIEF DESCRIPTION OF DRAWING(S)

DETAILED DESCRIPTION

Figure 1A:
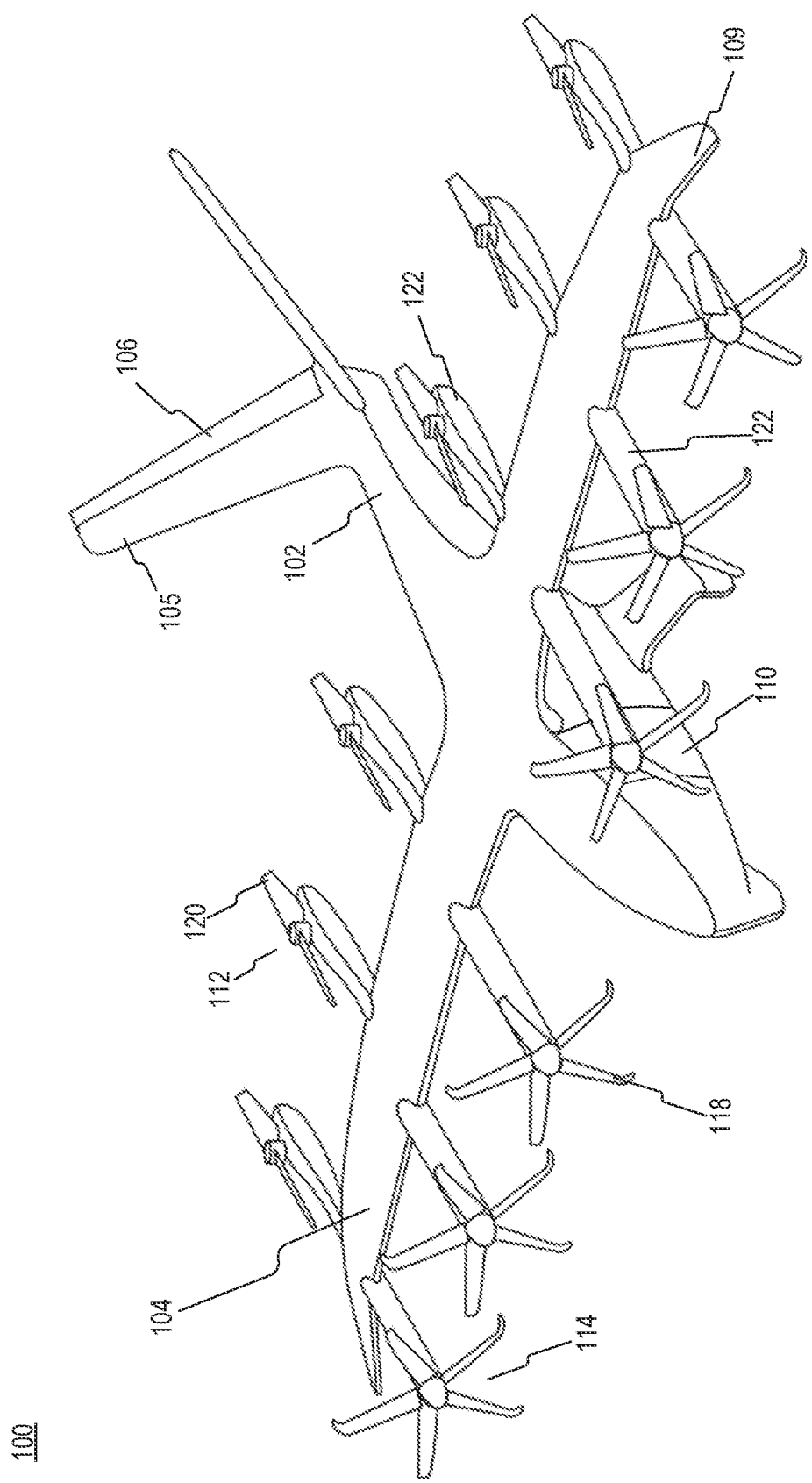
FIG. 1A illustrates an example VTOL aircraft in a cruise configuration, consistent with embodiments of the present disclosure.

The present disclosure addresses components of electric vertical takeoff and landing (eVTOL) aircraft primarily for use in a non-conventional aircraft. For example, the eVTOL aircraft of the present disclosure may be intended for frequent (e.g., over 50 flights per workday), short-duration flights (e.g., less than 100 miles per flight) over, into, and out of densely populated regions. The aircraft may be intended to carry 4-6 passengers or commuters who have an expectation of a low-noise and low-vibration experience. Accordingly, it may be desired that their components are configured and designed to withstand frequent use without wearing, that they generate less heat and vibration, and that the aircraft include mechanisms to effectively control and manage heat or vibration generated by the components. Further, it may be intended that several of these aircraft operate near each other over a crowded metropolitan area. Accordingly, it may be desired that their components are configured and designed to generate low levels of noise interior and exterior to the aircraft, and to have a variety of safety and backup mechanisms. For example, it may be desired for safety reasons that the aircraft are propelled by a distributed propulsion system, avoiding the risk of a single point of failure, and that they are capable of conventional takeoff and landing on a runway. Moreover, it may be desired that the aircraft can safely vertically takeoff and land from and into relatively restricted spaces (e.g., vertiports, parking lots, or driveways) compared to traditional airport runways while transporting around 4-6 passengers or commuters with accompanying baggage. These use requirements may place design constraints on aircraft size, weight, operating efficiency (e.g., drag, energy use), which may impact the design and configuration of the aircraft components.

Disclosed embodiments provide new and improved configurations of aircraft components that are not observed in conventional aircraft, and/or identified design criteria for components that differ from those of conventional aircraft. Such alternate configurations and design criteria, in combination addressing drawbacks and challenges with conventional components, yielded the embodiments disclosed herein for various configurations and designs of eVTOL aircraft components.

In some embodiments, the eVTOL aircraft of the present disclosure may be designed to be capable of both vertical and conventional takeoff and landing, with a distributed electrical propulsion system enabling vertical flight, forward flight, and transition. Thrust may be generated by supplying high voltage electrical power to the electrical engines of the distributed electrical propulsion system, which each may convert the high voltage electrical power into mechanical shaft power to rotate a propeller. Embodiments disclosed herein may involve optimizing the energy density of the electrical propulsion system. Embodiments may include an electrical engine connected to an onboard electrical power source, which may include a device capable of storing energy such as a battery or capacitor, or may include one or more systems for harnessing or generating electricity such as a fuel powered generator or solar panel array Some disclosed embodiments provide for weight reduction and space reduction of components in the aircraft, thereby increasing aircraft efficiency and performance. Given focus on safety in passenger transportation, disclosed embodiments implement new and improved safety protocols and system redundancy in the case of a failure, to minimize any single points of failure in the aircraft propulsion system. Some disclosed embodiments also provide new and improved approaches to satisfying aviation and transportation laws and regulations.

In preferred embodiments, the distributed electrical propulsion system may include twelve electrical engines, which may be mounted on booms forward and aft of the main wings of the aircraft. The forward electrical engines may be tiltable mid-flight between a horizontally oriented position (e.g., to generate forward thrust) and a vertically oriented position (e.g., to generate vertical lift). The forward electrical engines may be of a clockwise type or counterclockwise type in terms of direction of propeller rotation. The aft electrical engines may be fixed in a vertically oriented position (e.g., to generate vertical lift). They may also be of a clockwise type or counterclockwise type in terms of direction of propeller rotation. In some embodiments, an aircraft may possess various combinations of forward and aft electrical engines. For example, an aircraft may possess six forward and six aft electrical engines, four forward and four aft electrical engines, or any other combination of forward and aft engines, including embodiments where the number of forward electrical engines and aft electrical engines are not equivalent. In some embodiments, an aircraft may possess four forward and four aft propellers, where at least four of these propellers comprise tiltable propellers.

In preferred embodiments, for a vertical takeoff and landing (VTOL) mission, the forward electrical engines as well as aft electrical engines may provide vertical thrust during takeoff and landing. During flight phases where the aircraft is in forward flight-mode, the forward electrical engines may provide horizontal thrust, while the propellers of the aft electrical engines may be stowed at a fixed position in order to minimize drag. The aft electrical engines may be actively stowed with position monitoring. Transition from vertical flight to horizontal flight and vice-versa may be accomplished via the tilt propeller subsystem. The tilt propeller subsystem may redirect thrust between a primarily vertical direction during vertical flight mode to a mostly horizontal direction during forward-flight mode. A variable pitch mechanism may change the forward electrical engine's propeller-hub assembly blade collective angles for operation during the hover-phase, transition phase, and cruise-phase.

In some embodiments, in a conventional takeoff and landing (CTOL) mission, the forward electrical engines may provide horizontal thrust for wing-borne take-off, cruise, and landing. In some embodiments, the aft electrical engines may not be used for generating thrust during a CTOL mission and the aft propellers may be stowed in place.

In some embodiments, an electric engine may be housed or connected to a boom of an aircraft and include a motor, inverter, and gearbox. In some embodiments, the motor, inverter, and gearbox may be interfaced such that they share a central axis. In some embodiments, the torque originating in the motor may be sent away from the propellers of the propulsion system and to a gearbox. In some embodiments, a gearbox may provide a gear reduction and then send the torque, via a main shaft, back through a bearing located inside the motor and to the propeller. In some embodiments, an inverter may be mounted on the rear of a gearbox such that a main shaft does not travel through the inverter when outputting torque to the propeller.

In some embodiments, a tilt propeller system may include a linear or rotary actuator to change the orientation of a propulsion system during operation. In some embodiments, the pitch of the propulsion system may be changed as a function of the orientation of the propulsion system. In some embodiments, a rotary actuator may include a motor, inverter, and gearbox. In some embodiments, a gearbox may include various types of gears interfacing to provide a gear reduction capable of orienting the propulsion system. In some embodiments, a tilt propeller system may include a redundant configuration such that multiple motors, inverters, and gearboxes are present and interface using a gear. In some embodiments, a configuration utilizing multiple motors, gearboxes, and inverters may allow a failed portion of the redundant configuration to be driven by the motor, inverter, and gearbox of another portion of the configuration. In some embodiments, a gearbox configuration may also allow the tilt propeller system to maintain a propulsion system orientation with the help of, or without, additional power being provided by the system.

In some embodiments, an electrical propulsion system as described herein may generate thrust by supplying High Voltage (HV) electric power to an electric engine, which in turn converts HV power into mechanical shaft power which is used to rotate a propeller. As mentioned above, an aircraft as described herein may possess multiple electric engines which are boom-mounted forward and aft of the wing. The amount of thrust each electric engine generates may be governed by a torque command from the Flight Control System (FCS) over a digital communication interface to each electric engine. Embodiments may include forward electric engines, and may be able to alter their orientation, or tilt. Additional embodiments include forward engines that may be a clockwise (CW) type or counterclockwise (CCW) type. The forward electric engine propulsion subsystem may consist of a multi-blade adjustable pitch propeller, as well as a variable pitch subsystem.

In some embodiments, an aircraft may include aft engines, or lifters, that can be of a clockwise (CW) type or counterclockwise (CCW) type. Additional embodiments may include aft electric engines that utilize a multi-blade fixed pitch propeller.

As described herein, the orientation and use of electric propulsion systems may change throughout the operation of the aircraft. In some embodiments, during vertical takeoff and landing, the forward propulsion systems as well as aft propulsion systems may provide vertical thrust during takeoff and landing. During the flight phases where the aircraft is in forward flight-mode, the forward propulsion systems may provide horizontal thrust, while the aft propulsion system propellers may be stowed at a fixed position in order to minimize drag. The aft electric propulsion systems may be actively stowed with position monitoring. Some embodiments may include a transition from vertical flight to horizontal flight and vice-versa. In some embodiments, the transitions may be accomplished via the tilt propeller system (TPS). The TPS redirects thrust between a primarily vertical direction during vertical flight mode to a mostly horizontal direction during forward-flight mode. Additional embodiments may include a variable pitch mechanism that may change the forward propulsion system propeller-hub assembly blade collective angles for operation during the hover-phase, cruise-phase and transition phase. Some embodiments may include a Conventional Takeoff and Landing (CTOL) configurations such that the tilters provide horizontal thrust for wing-borne take-off, cruise and landing. The aft electronic engines are not used for generating thrust during a CTOL mission and the aft propellers are stowed in place.

As disclosed herein, an electrical engine may include an inverter and motor; or inverter, gearbox, and motor across various configurations, such as representative configurations as described herein. For example, an electrical engine may include an electrical motor, gearbox, and inverter that all share the same central axis. Additionally, the central axis may be configured along an axis of an output shaft going to the propeller of the aircraft. In such an exemplary configuration, the motor, gearbox, and inverter would all share the output shaft as a central axis and would be circularly oriented around the output shaft. Additional embodiments may include a motor, gearbox, and inverter that are mounted together in a sequence, or a configuration where some of the components are mounted together, such as the motor and gearbox, and another component is located elsewhere, such as the inverter, but wiring systems are used to connect the electrical engine.

As mentioned above, an electrical engine for an aircraft as described here may include some or all of a motor, inverter, and gearbox. Various configurations may include an inverter and motor such that the output shaft of a motor directly provides the speed and torque for a propeller shaft. Additional embodiments of an electrical engine may include a motor, inverter, and a gearbox, wherein the output of a motor may travel through a gearbox that is connected to the output shaft for the propeller; a motor, inverter, and gearbox wherein the output from the motor travels away from the propeller, through a gearbox, where the output shaft for the propeller travels back through the gearbox and motor to the propeller. As described herein, an electrical engine may account for any combination or orientation of some or all of a motor, inverter, and gearbox. Additionally, each configuration or orientation of the electrical engine as disclosed herein may include cooling via air-cooling, coolant liquid, or a mixture of both.

For example, a configuration of an electrical engine may include a motor and inverter wherein the motor is in between the propeller of the aircraft and the inverter. Additionally, a motor may include a gearbox. Further, an inverter may share the same central axis as a motor wherein the inverter may be located in an enclosure that is cantilevered off of the rear of the motor and may be air cooled. It is recognized that such an inverter orientation may not be an optimum configuration in terms of the enclosure required to achieve such a cantilevered orientation. Additionally, a motor in this configuration utilizing air cooling may comprise potting material and air fins to assist with cooling of the motor may lead to an even larger increase in mass of the system.

Some embodiments may include an electrical engine, wherein inverter modules may be mounted on the outside of a motor enclosure. Additional embodiments may include an electrical engine wherein an inverter may be mounted on top of an electrical motor such that the air-cooling fins of the inverter are underneath the propeller.

Embodiments of an electrical motor may comprise a stator enclosure, a wound stator assembly, a rotor, various bearings, and any additional components such that to assist in transferring the speed and torque generated by the motor to a propeller.

It is understood that an electrical engine may generate heat during operation and may comprise a heat management system to ensure components of the electrical engine do not fail during operation. In some embodiments, coolant may be used and circulated throughout individual components of the engine, such as an inverter, gearbox, or motor, through some of the components, or through all of the components of the engine to assist with managing the heat present in the engine. Additional embodiments may include using air cooling methods to cool the electrical engine or using a mixture of coolant and air to manage the heat generated during operation in the electrical engine. In some embodiments, the coolant being used may also be the same liquid that is being used as lubricant throughout the inverter, gearbox, or motor. For example, the inverter, gearbox, and motor may be cooled using a liquid or air, or a mixture of air and liquid cooling could be used, such as cooling the motor using air cooling and using liquid cooling in the inverter and gearbox, or any other combination of air and liquid cooling across the inverter, gearbox, and motor or even subsets of those components.

In some embodiments, oil may be used as a lubricant throughout an electrical engine and may also be used as coolant fluid to assist in managing the heat generated by the engine during operation. Further to this example, different amounts of oil may be used to act as both lubricant and coolant fluid in the electrical engine, such as less than one quart, less than two quarts, or any other amount of oil needed to lubricate and cool the electrical engine, in combination with or without the assistance of air cooling. As has been disclosed herein, an electrical engine may have different primary functionalities such as being used only for lifting and landing, and as such only being used in one orientation, or being used during all stages of flight such as lifting, landing, and in-flight.

Additional embodiments of electrical engines may include active protection features in the forward and aft electrical engines such as monitoring internal temperatures throughout the engine operation, including oil temperature, stator winding sets, inverter bulk capacitors, power modules, control board power modules, control board control processors, control board monitor processors, internal hot-spots, and other various locations throughout the engine. Embodiments may include overtemperature limits that take into account known failure temperatures and operating limits in relation to auto-ignition temperatures of fluids. Some embodiments may include a High Voltage Power System that may have fuses at the high voltage battery terminals which may rapidly disconnect the engine electrical connection irreversibly to mitigate overcurrent events. This overcurrent protection may be activated when the electric engine current draw is greater than the Overcurrent operating point. As such, in some embodiments, failure conditions which lead to overcurrent may only lead to a transient overheating, arc or spark faults.

As detailed above, embodiments of the aircraft may include many moveable structural flight elements that allow pilots to safely control the aircraft. Flight control surfaces (e.g., ailerons, elevators, rudders etc.) are critical to controlling the positioning of the aircraft. Changes to the orientation of these surfaces changes the airflow and pressure distribution around the aircraft, allowing the pilot to control the movement of the aircraft in three axes of rotation. Similarly, rotation and orientation control of rotors and proprotors may provide the lift required for vertical take-off and landing, and hovering. Rotation of propellers may provide the thrust required to move the aircraft through the air. The movement of each of these flight elements is critical to the safety and stability of the aircraft. In normal operation during flight, powered motors control the movement of these flight elements.

When an aircraft is parked or taxiing, power may be disconnected, and the motors of these flight elements may be unloaded. On windy days, ground gusts may cause uncontrolled movement in the flight elements potentially subjecting them to damage which could introduce safety hazards on subsequent flights. Further, this movement may create dangerous conditions for maintenance personnel.

Similarly, in flight, a failure and/or loss of power to the flight element motors may cause uncontrolled movement of flight elements. For example, a failure and/or loss of power to a flight control surface may contribute to aerodynamic flutter and result in excess movement and damage to aircraft flight elements. Damage to the flight elements may be costly to fix, result in aircraft downtime, or, if undetected, may result in unsafe flight conditions. For example, a failure, loss of engine power, and/or low angle pitch of a propeller may cause the propeller rotation speed to increase to a level that exceeds its structural dynamic limits or hub or blade structural integrity and result in a catastrophic aircraft condition.

The Federal Aviation Administration (FAA) has recognized the risks associated with these moveable flight elements and has issued guidelines for tying down moveable parts and limiting propeller speed during flight. However, tie-down procedures are not always feasible, as when weather conditions make approaching the aircraft unsafe or while the aircraft is in flight. Therefore, there is a need to dampen the movement of moveable flight elements to reduce or eliminate the potential for damage to these elements.

Further, solving the problem of uncontrolled movement of flight elements is particularly important in electric aircrafts or other aircrafts that use electrically actuated flight elements. Conventional gas-powered aircrafts typically include hydraulically actuated flight elements, and residual hydraulic pressure acts to dampen the movement of the flight elements. When flight elements are electrically actuated, there is no hydraulic pressure to help dampen their movement. Some aircrafts with electrically actuated flight elements employ mass balance devices to help dampen movement of flight elements. However, these mass balance devices add additional weight to the aircraft, negatively effecting the aircraft's range and maneuverability. Therefore, there is a need to dampen the movement of electrically actuated flight elements.

Embodiments of the present disclosure solve these and other problems by creating a counter-torque opposing the movement of the flight element and by dissipating the excess energy as heat. As a result, even when a motor associated with a flight element is unloaded, the motor control system dampens the movement of the flight element avoiding damage to the aircraft and/or unsafe conditions.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims.

Figure 1B:
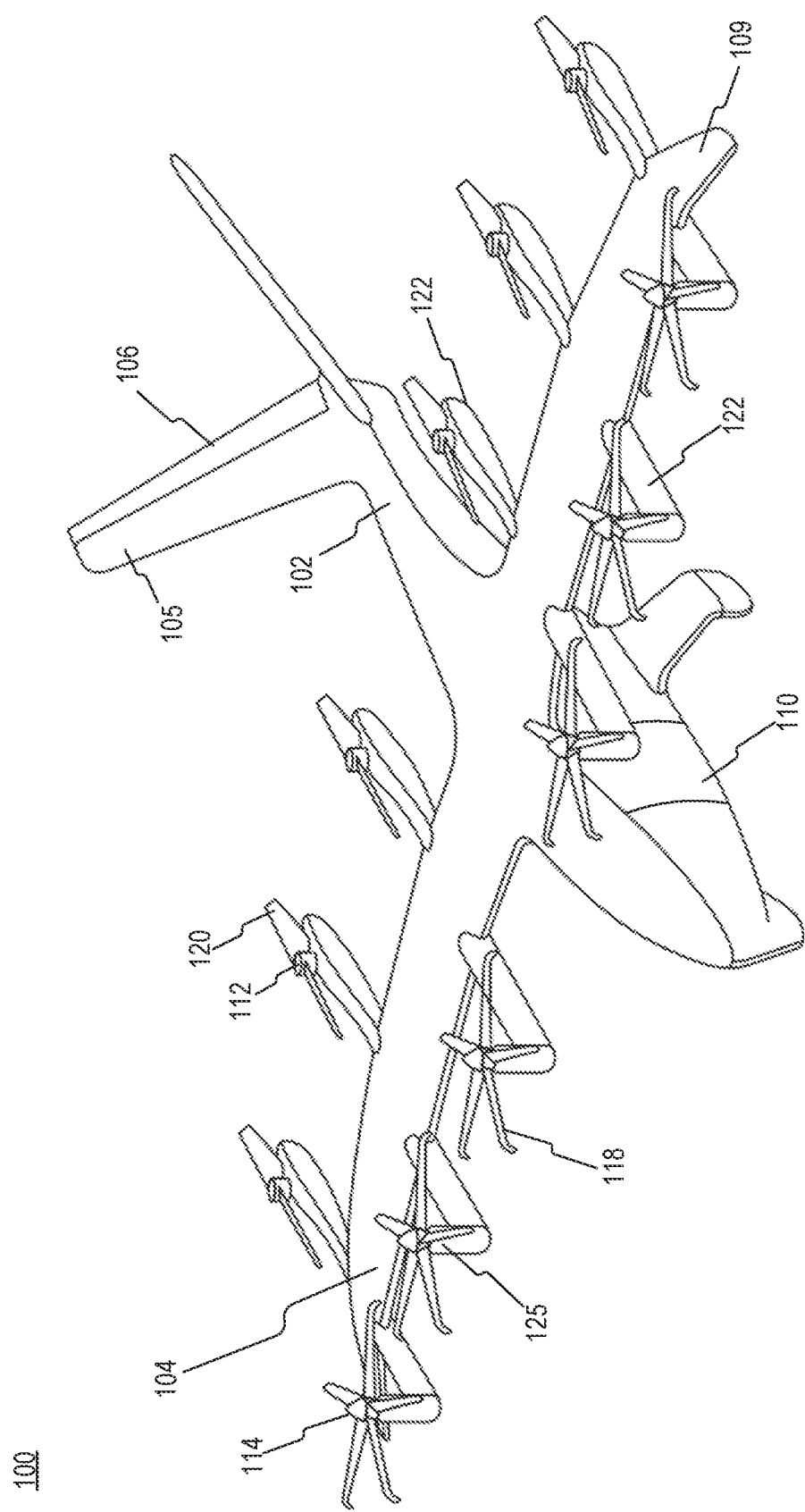
FIG. 1B illustrates an example VTOL aircraft in a lift configuration, consistent with embodiments of the present disclosure.

FIGS. 1A-B illustrate a VTOL aircraft 100 in a cruise configuration and a vertical take-off, landing and hover configuration (also referred to herein as a "lift" configuration), respectively, consistent with embodiments of the present disclosure. The aircraft 100 may include a fuselage 102, wings 104 mounted to the fuselage 102, tail 105, and one or more rear stabilizers 106 mounted to the tail 105 or the rear of the fuselage 102. A plurality of lift propellers 112 may be mounted to wings 104 and configured to provide lift for vertical take-off, landing and hover. A plurality of tilt propellers 114 may be mounted to wings 104 and may be tiltable between the cruise configuration in which they provide forward thrust to aircraft 100 for horizontal flight, as shown in FIG. 1A, and the lift configuration in which they provide a portion of the lift required for vertical take-off, landing and hovering, as shown in FIG. 1B. As used herein, a lift configuration may refer to a tilt propeller orientation in which the tilt propeller thrust is providing primarily lift to the aircraft. A cruise configuration may refer to a tilt propeller orientation in which the tilt propeller thrust is providing primarily forward thrust to the aircraft. Alternatively, a cruise configuration may refer to a configuration in which a lift propeller is stowed.

In some embodiments, lift propellers 112 may be configured for providing lift only, with all propulsion being provided by the tilt propellers. Accordingly, lift propellers 112 may be in fixed positions and may only generate thrust during take-off, landing, and hover. Meanwhile, tilt propellers 114 may be tilted to lift configurations in which their thrust is directed downwardly for providing additional lift.

For forward flight, tilt propellers 114 may tilt from their lift configurations to their cruise configurations. In other words, the pitch and tilt angle of tilt propellers 114 may be varied from an orientation in which the tilt propeller thrust is directed downward (to provide lift during vertical take-off, landing and hover) to an orientation in which the tilt propeller thrust is directed rearward (to provide forward thrust to aircraft 100). The tilt propellers may tilt about axes that may be perpendicular to the forward direction of the aircraft 100. When the aircraft 100 is in full forward flight during the cruise configuration, lift may be provided entirely by wings 104. Meanwhile, lift propellers 112 may be shut off. The blades 120 of lift propellers 112 may be locked in low-drag positions for aircraft cruising. In some embodiments, lift propellers 112 may each have two blades 120 that may be locked for cruising in minimum drag positions in which one blade is directly in front of the other blade as illustrated in FIG. 1A. In some embodiments, lift propellers 112 have more than two blades. In some embodiments, tilt propellers 114 include more blades 118 than lift propellers 112. For example, as illustrated in FIGS. 1A-B, lift propellers 112 may each include, e.g., two blades and tilt propellers 114 may each include, e.g., five blades. In some embodiments, tilt propellers 114 may have, e.g., from 2 to 5 blades.

In some embodiments, the aircraft may include only one wing 104 on each side of fuselage 102 (or a single wing that extends across the entire aircraft) and at least a portion of lift propellers 112 may be located rearward of wings 104 and at least a portion of tilt propellers 114 may be located forward of wings 104. In some embodiments, all of lift propellers 112 may be located rearward of wings 104 and all of tilt propellers 114 may be located forward of wings 104. According to some embodiments, all lift propellers 112 and tilt propellers 114 may be mounted to the wings—i.e., no lift propellers or tilt propellers may be mounted to the fuselage. In some embodiments, lift propellers 112 may be all located rearwardly of wings 104 and tilt propellers 114 may be all located forward of wings 104. According to some embodiments, all lift propellers 112 and tilt propellers 114 may be positioned inwardly of the wing tips 109.

In some embodiments, lift propellers 112 and tilt propellers 114 may be mounted to wings 104 by booms 122. Booms 122 may be mounted beneath wings 104, on top of the wings, and/or may be integrated into the wing profile. In some embodiments, one lift propeller 112 and one tilt propeller 114 may be mounted to each boom 122. Lift propeller 112 may be mounted at a rear end of boom 122 and tilt propeller 114 may be mounted at a front end of boom 122. In some embodiments, lift propeller 112 may be mounted in a fixed position on boom 122. In some embodiments, tilt propeller 114 may mounted to a front end of boom 122 via a hinge. Tilt propeller 114 may be mounted to boom 122 such that tilt propeller 114 is aligned with the body of boom 122 when in the cruise configuration, forming a continuous extension of the front end of boom 122 that minimizes drag for forward flight.

In some embodiments, aircraft 100 may include, e.g., one wing on each side of fuselage 102 or a single wing that extends across the aircraft. According to some embodiments, the at least one wing 104 is a high wing mounted to an upper side of fuselage 102. According to some embodiments, the wings include control surfaces, such as flaps, ailerons or flaperons. According to some embodiments, the wings may have curved wing tips 109 for reduced drag during forward flight.

In some embodiments, rear stabilizers 106 include control surfaces, such as one or more rudders, one or more elevators, and/or one or more combined rudder-elevators. The wing(s) may have any suitable design. For example, the wings have a tapering leading edge or a tapering trailing edge. In some embodiments, the wings may have a substantially straight leading edge in the central section of wings 104.

Figure 2:
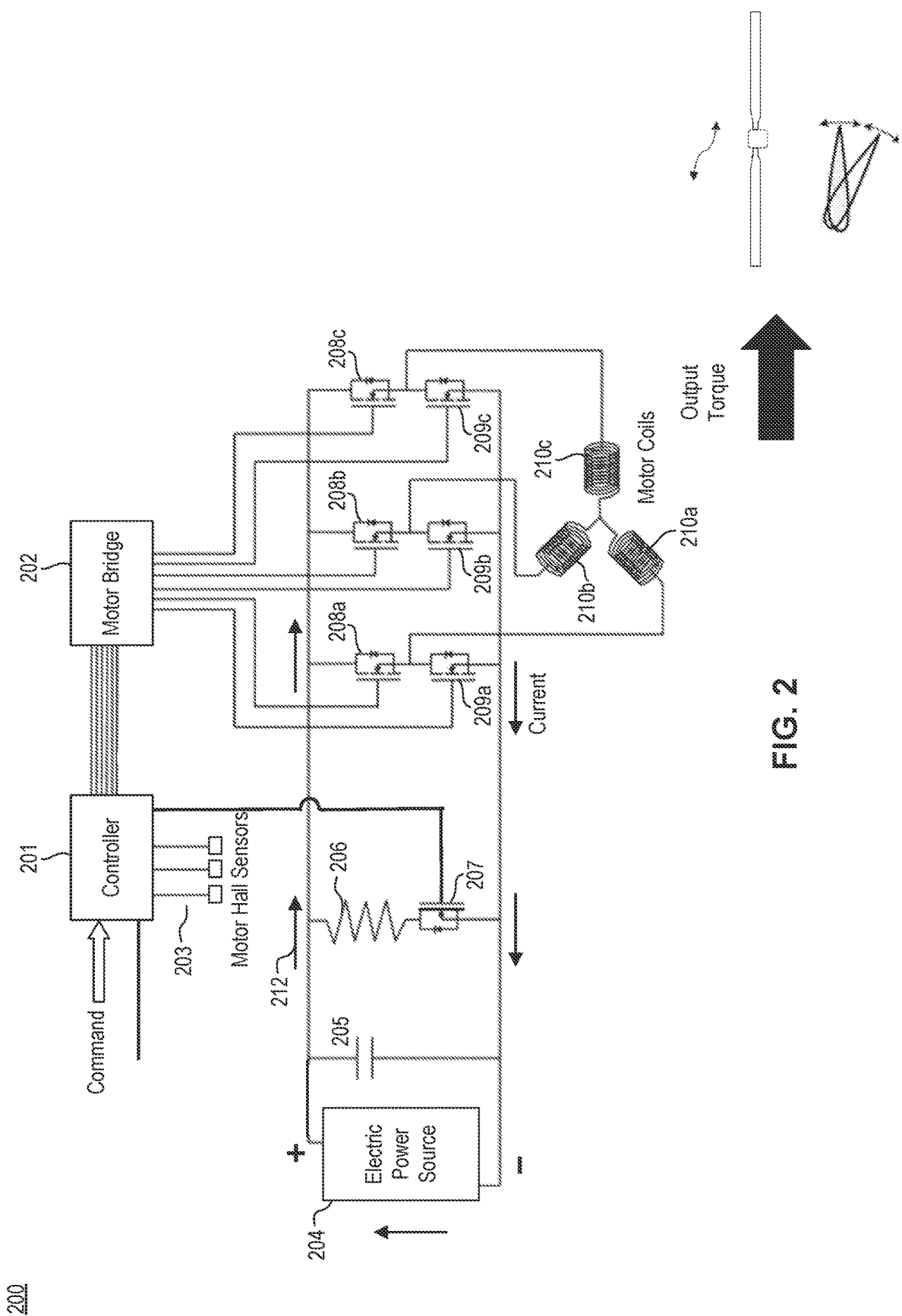
FIG. 2 illustrates a motor control system including a brake resistor in a loaded condition, consistent with embodiments of the present disclosure.

FIG. 2 illustrates a motor control system 200 operating in a loaded condition, consistent with embodiments of the present disclosure. Motor control system 200 may include an electric power source 204. In some embodiments, the power source 204 may include a single battery, while in other embodiments the power source 204 may include a plurality of batteries arranged in series, parallel, or a combination of series and parallel. In some embodiments, the power source is a battery pack and a battery management system as detailed in PCT/US2023/79690 incorporated by reference herein in its entirety. In FIG. 2, depicting a "loaded" condition, the power source 204 is providing power to the circuitry as schematically illustrated by the closed switch 211. Current 212 flows from the negative side of the power source to the positive side to provide power to the motor.

In some embodiments, the motor may be a permanent magnet motor, with one or more rotating permanent magnets connected to a gearbox and/or one or more flight elements. In some embodiments, the rotor may include permanent magnets and the stator windings (e.g. 210a-210c) may produce a magnetic field. In some embodiments, the motor may be a one-phase, two-phase, or three-phase motor, while in other embodiments the motor may have a different number of phases. In some embodiments, the motor is a DC motor, such as a brushless DC motor. In some embodiments, the DC motor controls one or more flight control surfaces (e.g. slat, aileron, tab, spoiler, elevator, rudder etc.), while in other embodiments the DC motor controls one or more other flight elements.

In some embodiments, the motor is an AC motor. In an AC motor configuration, the controller 201 and/or motor bridge 202 may provide a sinusoidal output voltage to the stator windings 210a-210c. In some embodiments, the sinusoidal output voltage is created by the controller 201 and/or motor bridge 202 switching on and off transistors 208a-c and 209a-c using a Pulse Width Modulation Strategy (PWM). In some embodiments, the AC motor configuration controls a rotor, a proprotor, and/or a propeller, while in other embodiments the AC motor controls one or more other flight elements. In some embodiments, the motor may include three stator windings, as illustrated by 210a-210c.

In some embodiments, a capacitor 205 is connected in parallel to the electric power source 204. In some embodiments, capacitor 205 may be a bulk capacitor. The bulk capacitor 205 stores an electrical charge and ensures that a steady current supply is provided to the connected circuitry. Further, in some embodiments, the bulk capacitor 205 may provide a path for ripple currents resulting from a rotating magnetic field.

The controller 201 and/or motor bridge 202 may be a hardware device, such as a computer, processor, and/or microprocessor. In some embodiments, the controller 201 and/or motor bridge 202 may receive control signal commands from a flight control system, flight controls computer, autopilot, and/or other computer system that regulates the aircraft flight controls. In some embodiments, the controller 201 is part of the flight control system, flight controls computer, autopilot, and/or other computer system that regulates the aircraft flight controls. In some embodiments, the controller 201 receives signals from a battery management system, battery management unit, and/or any other device configured to monitor and/or control electric power source 204. In some embodiments, the controller 201 and/or motor bridge 202 may be housed with the transistors, brake resistor, and/or other motor control elements. In other embodiments, the controller and/or motor bridge 202 may be housed separately from transistors, brake resistor, and/or other motor control elements.

Based on the received control signal commands, the controller 201 and/or the motor bridge 202 may regulate voltage to the transistors 208a-c and 209a-c. In some embodiments, the controller 201 may provide signals to the motor bridge 202, while in other embodiments the controller 201 may directly regulate voltage to downstream devices, such as transistors 208a-c and/or 209a-c. Motor Hall sensors 203 may provide information on the positioning and speed of a magnetic rotor (not shown) to the controller 201, which may make changes based on the feedback.

Transistors 208a-c and 209a-c connect and disconnect current flow based on whether a voltage is received from the controller 201 and/or motor bridge 202. In some embodiments, the transistors are bipolar transistors, field-effect transistors (e.g., a MOSFET), and/or insulated-gate bipolar transistors (e.g., an IGBT). In some embodiments, the transistors 208a-c and 209a-c are enhancement mode transistors and when the controller 201 and/or motor bridge 202 generates a voltage across the transistor (208a-c and/or 209a-c), the transistor may allow the current from electric power source 204 to travel across its terminals, connecting the power to the stator windings 210a-210c. In other embodiments, the transistors 208a-c and 209a-c are depletion mode transistors and when the controller 201 and/or motor bridge 202 generates no voltage across the transistor (208a-c and/or 209a-c), the transistor may allow the current from electric power source 204 to travel across its terminals, connecting the power to the stator windings 210a-210c. In some embodiments, transistors 208a-c are enhancement mode transistors and transistors 209a-c are depletion mode transistors. In some embodiments, transistors 208a-c are depletion mode transistors and transistors 209a-c are enhancement mode transistors. The controller 201 and/or motor bridge 202 selectively control the power to each stator windings 210a-210c in order to generate a magnetic field and control an associated flight element.

Stator windings 210a-210c are coils of conductors (e.g., insulated aluminum or copper wire) that each generate a magnetic field when energized. While FIG. 2 shows three stator windings, the stator may include any number of windings. For example, the motor may include one, two, or any number of windings. The stator windings may also be wound in a variety of different ways. In some embodiments, the stator windings may be concentrated, while in other embodiments the windings may be distributed.

As discussed above, the controller 201 and/or motor bridge 202 may selectively control the voltage to each stator windings 210a-210c to generate a magnetic field. For example, in a first motor phase where stator winding 210c and 210a are magnetized, the controller 201 and/or motor bridge 202 may control the transistors 208c and 209a, to allow current to run through their terminals while keeping the remaining transistors closed. Current may flow across transistor 208c, through stator winding 210c, through stator winding 210a, and across transistor 209a, forming a completed circuit. In a second motor phase where stator winding 210a and 210b are magnetized, the controller 201 and/or motor bridge 202 may control the transistors 208b and 209a, to allow current to run through their terminals while keeping the remaining transistors closed. Current may flow across transistor 208b, through stator winding 210b, through stator winding 210a, and across transistor 209a, forming a completed circuit. In a third motor phase where stator winding windings 210b and 210c are magnetized, the controller 201 and/or motor bridge 202 may control the transistors 208c and 209b, to allow current to run through their terminals while keeping the remaining transistors closed. FIG. 2 is an example embodiment, but a different number of phases and/or combination of windings may be used.

The magnetic fields created by the stator windings 210a-210c may interact with a magnetic rotor (not shown) and cause the rotor to rotate or otherwise move. The rotor may be operably coupled to a moveable flight element. For example, the rotor may be operably coupled to a flight control surface (e.g. slat, aileron, tab, spoiler, elevator, rudder etc.), rotor, proprotor, and/or a propeller. Therefore, in a loaded condition, the controller 201 and/or motor bridge 202 adjusts the power from electric power source 204 to the stator windings 210a-210c to control the movement of the flight element. In some embodiments, stator windings 210a-210c may be controlled to increase speed of a propeller, rotor, and/or proprotor. In some embodiments, stator windings 210a-210c may be controlled to adjust the position of a flight control surface (e.g. an angle), or the tilt orientation of a rotor and/or proprotor.

Depletion mode transistor 207 connects and disconnects current flow across the circuitry through a brake resistor 206 based on whether a voltage is received from the controller 201 and/or motor bridge 202. In some embodiments, the depletion mode transistor 207 is a bipolar transistor, field-effect transistor (e.g. a MOSFET), or an insulated-gate bipolar transistor (e.g. an IGBT). In a loaded condition with power source 204 connected, the controller 201 and/or motor bridge 202 generates a voltage across the depletion mode transistor 207 and the transistor does not allow the current from electric power source 204 to travel across its terminals. Therefore, in a loaded condition, the depletion mode transistor 207 keeps the brake resistor 206 unconnected from the rest of the circuitry, as shown in FIG. 2.

Brake resistor 206 is connected in series to depletion mode transistor 207 and is used to dissipate heat and slow and/or stop the moving flight element. In some embodiments, the brake resistor may have a fixed resistance, while in other embodiments the brake resistor 207 may have a variable resistance value that can be adjusted. In some embodiments, a resistance value may be selected that is a minimum resistance adequate to dampen the flight element movement when accounting for the motor back EMF voltage. Resistance may be selected based on a function of Resistance=(Voltage)^2/(Damping Power), wherein damping power is based on the flight element hinge moment times rate. A smaller resistance value may be used when a larger counter torque is required to oppose the movement of a flight element. The smaller resistance value may allow a larger current flow through the stator windings 210a-210c creating a stronger magnetized field to oppose the motion of the rotor and connected flight element. In contrast, a larger resistance value may be used when a smaller counter torque is required to oppose the movement of a flight element. A larger resistance value may allow a smaller current flow through the stator windings 210a-210c creating a weaker magnetized field to oppose the motion of the rotor and connected flight element. In some embodiments, brake resistor 206 may be a single resistor, while in other embodiments the brake resistor 206 may include a plurality of resistors arranges in series, parallel, or a combination of series and parallel.

In some embodiments, the brake resistor 206 is able dissipate large amounts of heat created by the generated current. In some embodiments, the brake resistor 206 may be coupled with a heat sink and/or heat exchanger that allows for heat to be transferred off the resistor. For example, the resistor and/or other circuitry elements may be connected to a folded fin heat exchanger or any other type of heat exchanger. In some embodiments, oil or other coolant may be circulated to remove heat from the brake resistor 206. In some embodiments, the arrangement of the brake resistor 206 on a circuit board may allow for heat dissipation away from other board components.

Figure 3:
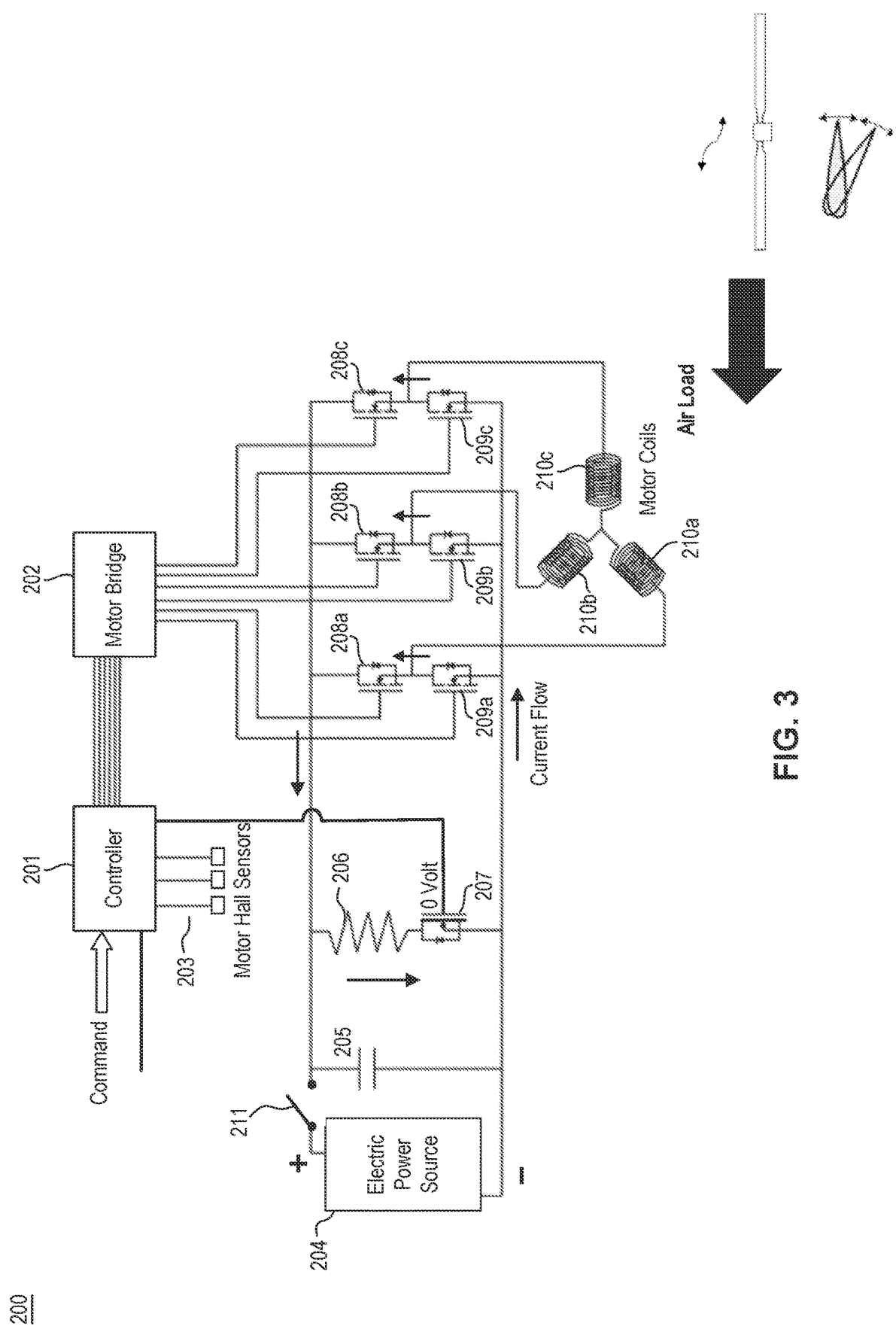
FIG. 3 illustrates a motor control system including a brake resistor in an unloaded condition, consistent with embodiments of the present disclosure.

FIG. 3 illustrates the motor control system 200 operating in an unloaded condition with electric power source 204 disconnected, consistent with embodiments of the present disclosure. Electric power source 204 may be disconnected because the aircraft is parked on the ground, is experiencing a power failure, is experiencing an electrical circuitry issue, is experiencing an issue with a flight element, or for any other reason. In some embodiments, the electric power source 204 may be disconnected based on a mode selected by a pilot of an aircraft (e.g. an off mode, standby mode, ground mode etc.). In some embodiments, the electric power source 204 may be disconnected based on the detection of a short circuit and/or overcurrent condition. For example, a battery management system associated with power source 204 and/or controller 201 may detect the short circuit and/or overcurrent condition and disconnect electric power source 204 (e.g. by blowing a fuse).

In some embodiments, the electric power source 204 may be disconnected based on detecting an issue with the positioning and/or movement of a flight element. For example, a flight control system and/or controller 201 may determine that the positioning of a flight element is incorrect (e.g. propeller pitch is too low) and/or that the movement of a flight element is incorrect or uncontrolled. Based on this determination, the flight control system, the battery management system, and/or the controller 201 may disconnect electric power source 204.

Based on air movement around the aircraft, the flight element and attached magnetic rotor may start moving with respect to the stator. The rotating magnetic field created by the rotor movement may interact with the stator coils 210a-210c to generate current across the circuitry as shown by the counterclockwise current flow 212. In some embodiments, during an unloaded condition, the controller 201 and/or motor bridge 202 may receive a signal to provide a voltage to enhancement mode transistors (208a-208c and 209a-209c), allowing the generated current to travel across their terminals and into the circuitry. In other embodiments, the transistors (208a-208c and 209a-209c) may be depletion mode transistors and, upon receiving no voltage from the controller 201 and/or motor bridge 202, the transistors may allow the generated current to travel across their terminals and into the circuitry. Similarly, in the unloaded condition, the controller 201 may no longer provide a voltage to the depletion mode transistor 207, allowing the generated current to travel across its terminals and through the brake resistor 206.

The current flow through the connected circuitry and brake resistor 206 generates a magnetic field in the stator windings 210a-210c that is relative to the rotation speed of rotating magnetic rotor (not shown). These magnetic fields may interact with the rotating magnetic rotor (not shown) and provide a counter torque opposing the rotation, with a stronger counter torque being provided at a higher rotor speed. Therefore, the connected circuitry and brake resistor 206 dampens the movement of the rotor and connected flight element. Further, the brake resistor 206 allows for the dissipation of the excess energy in the form of heat.

Figure 4:
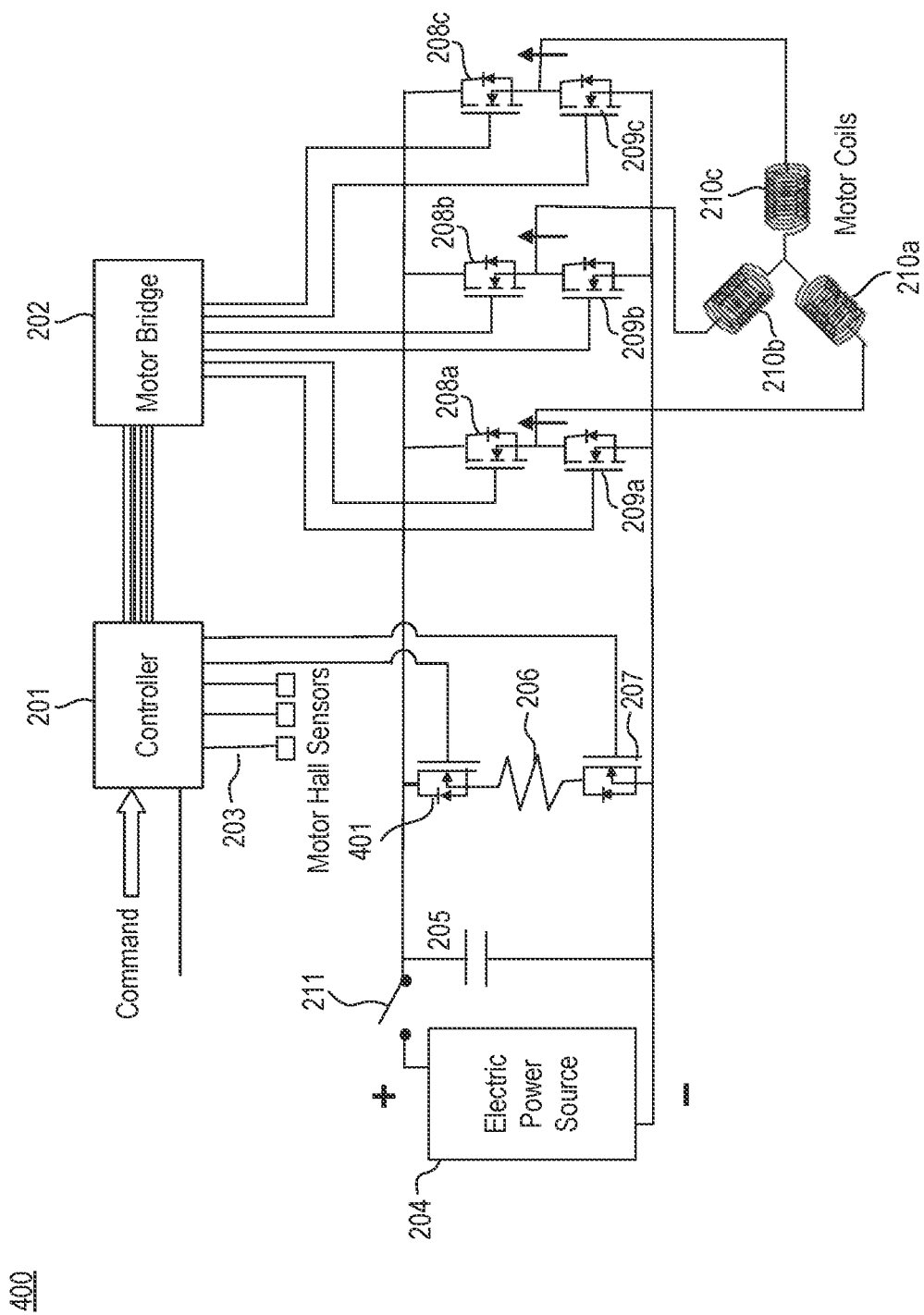
FIG. 4 illustrates a motor control system including a brake resistor between two depletion mode transistors, consistent with embodiments of the present disclosure.

FIG. 4 illustrates a motor control system 400 including a brake resistor 206 between two depletion mode transistors (207 and 401), consistent with embodiments of the present disclosure. FIG. 4 includes the same devices as control system 200 in FIG. 2 and FIG. 3, and it also includes a second depletion mode transistor 401. In some embodiments, the depletion mode transistor 401 is a bipolar transistor, field-effect transistor (e.g. a MOSFET), or an insulated-gate bipolar transistor (e.g. an IGBT). Similar to depletion mode transistor 207, depletion mode transistor 401 connects and disconnects current flow across the circuitry through a brake resistor 206 based on whether a voltage is received from the controller 201. In a loaded condition, the controller 201 generates a voltage across the depletion mode transistor 401 and the transistor does not allow the current from electric power source 204 to travel across its terminals. Therefore, the brake resistor 206 remains unconnected from the rest of the circuitry when the electric power source 204 is connected. However, similar to motor control system 200, in an unloaded condition, the controller 201 may no longer provide a voltage to the depletion mode transistors 207 and 401, allowing the generated current to travel across their terminals and through the brake resistor 206.

By providing two depletion mode resistors (207 and 401), control system 300 provides for redundancy, avoids a single point of failure, and increases the reliability of motor control. During loaded operations when power source 204 is connected (e.g. in flight), it is critical that the brake resistor 206 remains unconnected. Connecting the brake resistor 206 in a loaded condition may cause the resistor 206 to become overheated and may result in power drain and damage to the resistor 206, circuitry, and/or stator windings 210a-210c. The second depletion mode transistor ensures that if one of the depletion mode transistors (207 or 401) fails, the brake resistor 206 may remain unconnected. Therefore, power drain and damage to the motor system components can be avoided.

Figure 5:
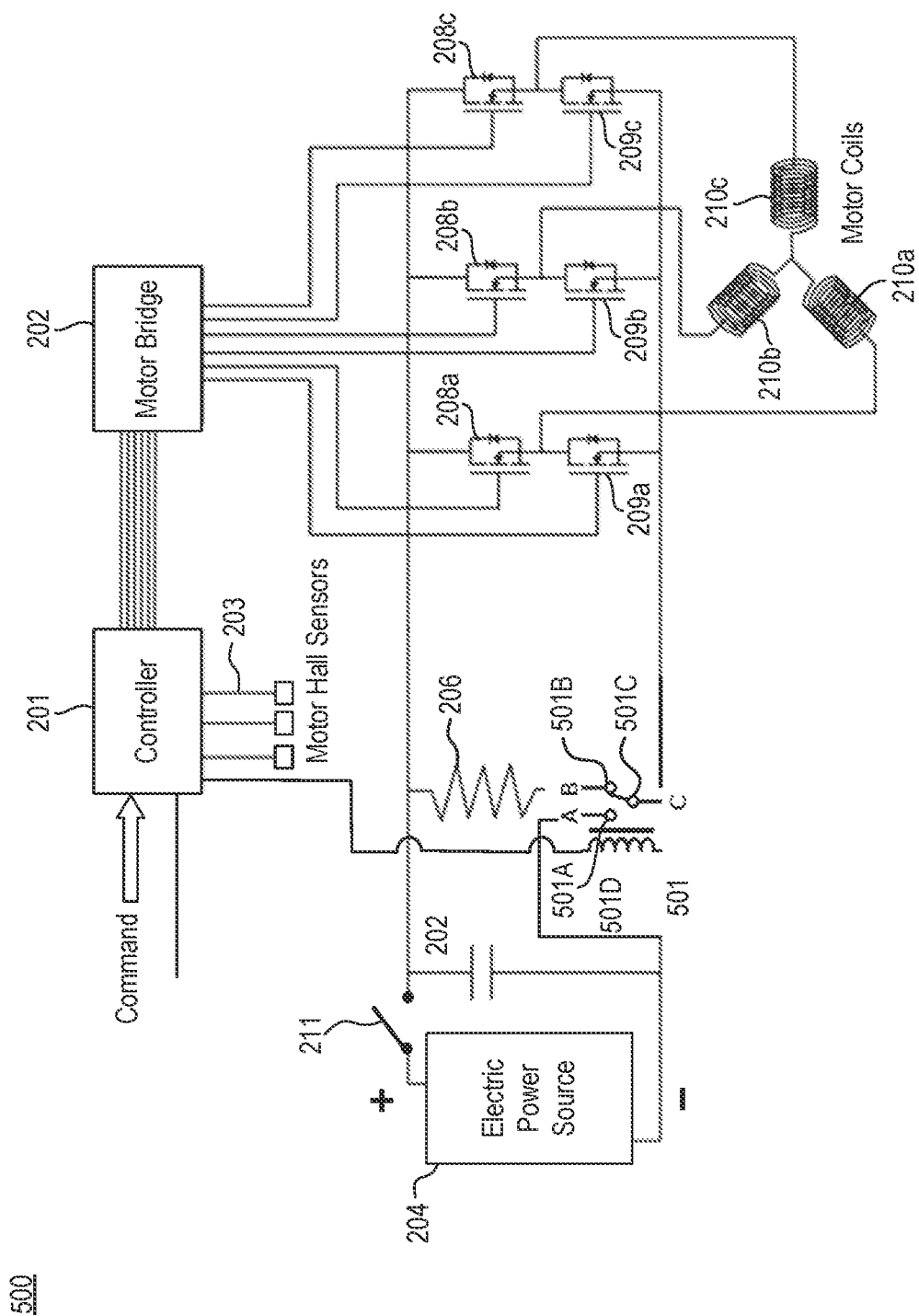
FIG. 5 illustrates a motor control system including a relay, consistent with embodiments of the present disclosure.

FIG. 5 illustrates a motor control system 500 including a relay 501, consistent with embodiments of the present disclosure. FIG. 5 includes the same devices as control system 200 in FIGS. 2 and 3, except the transistor 207 is replaced by a relay 501. In some embodiments, the relay 501 may be a single pole double throw (SDPT) relay, while in other embodiments any relay that allows for switching between two circuits may be included. The relay 501 may include an electromagnetic coil 501D, a common terminal 501C, a normally closed terminal 501A, and a normally open terminal 501B. In a loaded condition, controller 201 may cause a current to pass through the electromagnetic coil 501D, and the common terminal 501C may be connected to the normally open terminal 501A. Therefore, in a loaded condition the brake resistor 206 remains unconnected. In an unloaded condition, the controller 201 may not cause a current to pass through the electromagnetic coil 501D, and the common terminal 501C may be connected to the normally closed terminal 501B. Therefore, in an unloaded condition the brake resistor 206 may be connected, allowing the generated current to travel across terminals (501C and 501B) and through the brake resistor 206. While only a single relay 501 is shown in FIG. 5, the disclosure is not so limited. Similar to the transistors 401 and 207 in FIG. 4, a second relay may be included and provide for similar redundancy benefits described above.

Figure 6:
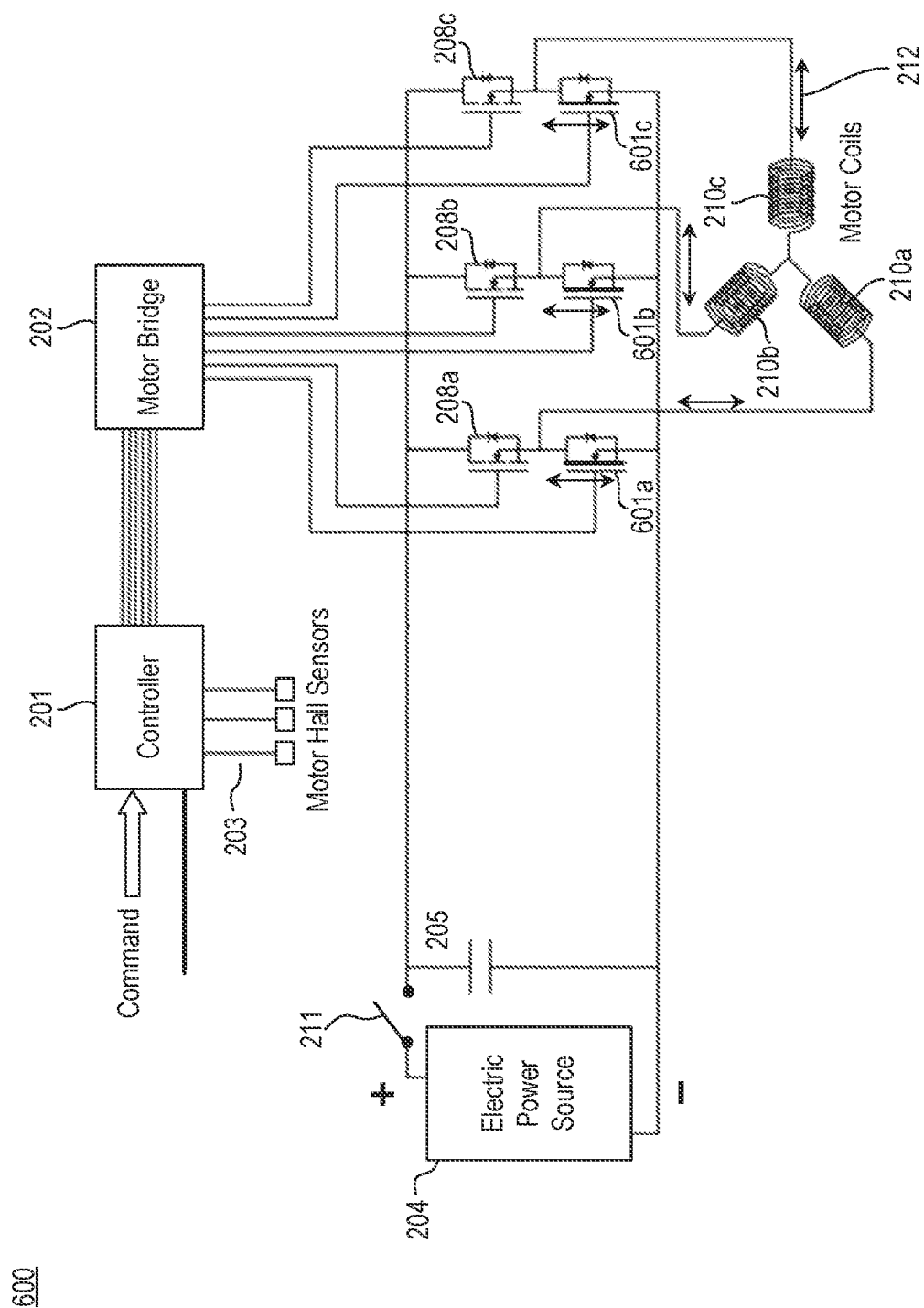
FIG. 6 illustrates a motor control system including a set of depletion mode transistors, consistent with embodiments of the present disclosure.

FIG. 6 illustrates a motor control system 600 including a set of transistors 601a-601c. FIG. 6 includes many of the same devices as control system 200 in FIGS. 2 and 3 (e.g. electric power source 204, capacitor 205, controller 201, sensors 203, and motor bridge 202). Similar to transistors 209a-c, transistors 601a-601c connect and disconnect current flow across the circuitry to the stator windings 210a-210c based on whether a voltage is received from the controller 201 and/or motor bridge 202. In some embodiments, the transistors 601a-601c are bipolar transistors, field-effect transistors (e.g. a MOSFET), or insulated-gate bipolar transistors (e.g. an IGBT). In some embodiments, transistors 601a-601c are depletion mode transistors and when the controller 201 and/or motor bridge 202 generates no voltage across the transistor 601a-601c, the transistors may allow the current to travel across their terminals. In some embodiments, the transistors 601a-601c are depletion mode transistors and the transistors 208a-208c are enhancement mode transistors. Therefore, during a loaded condition with power source 204 connected, the controller 201 and/or the motor bridge 202 may provide a voltage across enhancement mode transistors 208a-208c to allow current flow and may not provide a voltage across depletion mode transistor 601a-601c to allow current flow. For example, in one embodiment, to magnetize stator windings 210c and 210a, voltage may be provided to enhancement mode transistor 208c and no voltage may be provided to depletion mode transistor 601a, allowing the current to flow across transistor 208c, through stator winding 210c, through stator winding 210a, and across transistor 601a, forming a completed circuit.

During an unloaded condition with power source 204 unconnected, the controller 201 and/or the motor bridge 202 may not provide a voltage across enhancement mode transistors 208a-208c and may not provide a voltage across the depletion mode transistors 601a-601c. Therefore, during an unloaded condition, the current may flow through transistors 601a-601c and not transistors 208a-208c as shown by current lines 212. This may result in a short of all three motor phases and create a counter torque opposing the rotation of the magnetic rotor (not shown) and connected flight element.

Figure 7A:
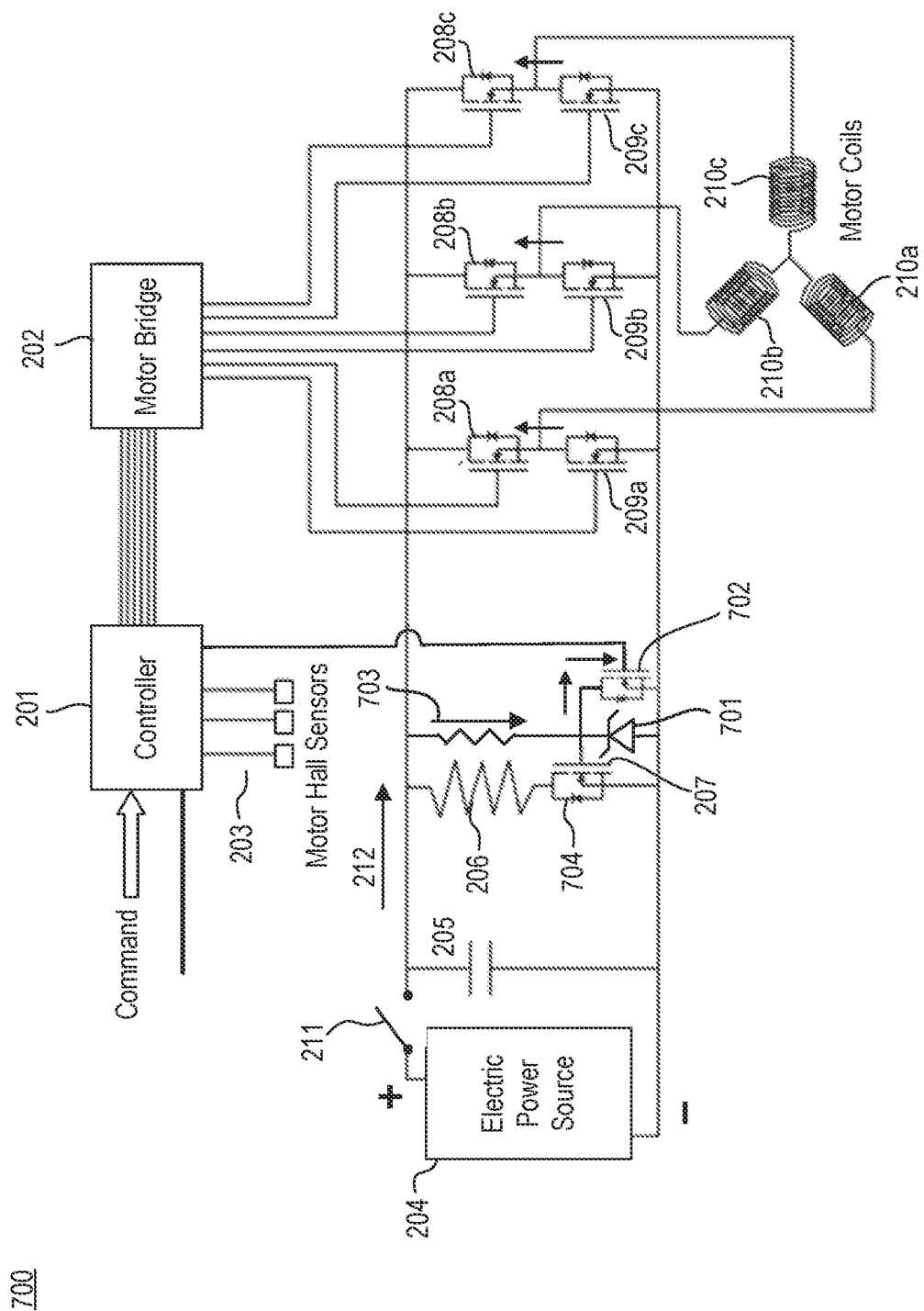
FIG. 7A illustrates a motor control system, including a passive discharge resistor and diode, in a capacitor discharging state, consistent with embodiments of the present disclosure.

FIG. 7a illustrates a motor control system 700 including a diode 701, an enhancement mode transistor 702, a passive discharge resistor 703, and an enhancement mode transistor 704, consistent with embodiments of the present disclosure. FIG. 7a includes many of the same devices as control system 200 in FIGS. 2 and 3 (e.g. electric power source 204, brake resistor 206, capacitor 205, controller 201, sensors 203, and motor bridge 202). In some embodiments, transistors 702 and/or 704 are bipolar transistors, field-effect transistors (e.g. a MOSFET), and/or insulated-gate bipolar transistors (e.g. an IGBT). Enhancement mode transistor 702 may allow current to travel across its terminals upon receiving a voltage from controller 201. Enhancement mode transistor 704 may allow current to travel across its terminals upon receiving a voltage from the circuitry through passive discharge resistor 703. In some embodiments, diode 701 may allow current to flow in both a forward and reverse direction. The diode 701 may be doped such that it only allows current to flow in the reverse direction when a certain specified threshold breakdown voltage is reached. In some embodiments, the threshold voltage may be between 1.2 volts –200 volts. Upon the threshold voltage being reached, diode 701 may allow current to flow through its terminals. In some embodiments, diode 701 may be a Zener diode, while in other embodiments diode 701 may be any device or circuitry that allows current to flow in the reverse direction after a threshold voltage has been reached. Passive discharge resistor 703 may be connected in series with the diode 701 to regulate the current to the diode 701. In a normal loaded condition with power source 204 connected, the motor control system may drive the motor as described above with reference to FIG. 2.

As shown in FIG. 7A, in an unloaded condition, control system 700 may allow for the discharge of stored energy in the bulk capacitor 205 prior to turning off the flight control system and associated controller 201 and/or motor bridge 202. For example, the control system 700 may allow for the discharge of the stored energy after flight for the safety of aircraft maintenance personnel. The controller 201 may provide a voltage to an enhancement mode transistor 702 allowing the current from the bulk capacitor 205 to flow through the passive discharge resistor 703 and across enhancement mode transistor 702, bypassing the Zener diode 701 and brake resistor 206, and allowing for discharge of the bulk capacitor 205.

Figure 7B:
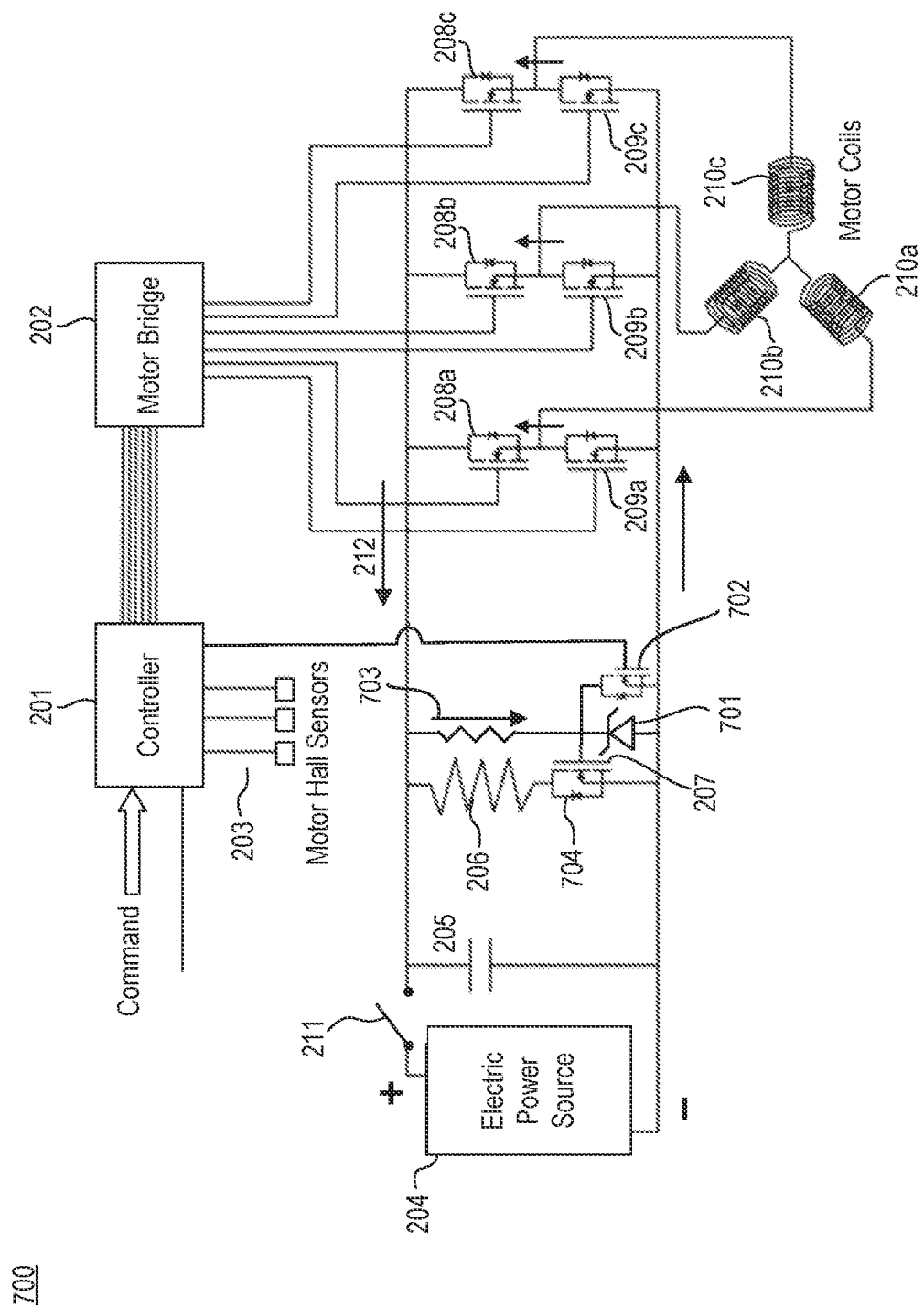
FIG. 7B illustrates a motor control system, including a passive discharge resistor and diode, in a damping state, consistent with embodiments of the present disclosure.

FIG. 7b illustrates a motor control system, including a passive discharge resistor and diode, in a damping state, consistent with embodiments of the present disclosure. As shown in FIG. 7b, in an unloaded condition, after flight control system and associated controller 201 and/or motor bridge 202 are powered off, control system 700 may dampen the movement of the flight elements. During an unloaded condition with power source 204 disconnected, higher winds may increase the movement of the flight element and the connected rotating magnetic rotor (not shown) inducing a larger back EMF (electromotive force) voltage into the circuitry as the rotation increases. The generated current from the back EMF voltage may be used to re-charge capacitor 205. As the back EMF voltage increases, voltage across the Zener diode 701 may also increase. When the voltage across the Zener diode 701 passes the breakdown threshold voltage, current may flow across the passive discharge resistor 703, creating a voltage for enhancement mode transistor 704. The enhancement mode transistor 704 may then allow the generated current to travel across its terminals and through brake resistor 206. As described above, the connected circuitry through stator windings 210a-210c and brake resistor 206 provides a counter torque which dampens the movement of the rotor (not shown) and connected flight element. Further, the brake resistor 206 allows for the dissipation of the excess energy in the form of heat.

The foregoing description has been presented for purposes of illustration. It is not exhaustive and does not limit the disclosure to the precise forms or embodiments disclosed. Modifications and adaptations of the disclosure will be apparent to those skilled in the art from consideration of the specification and practice of the disclosed embodiments.

Figure 8:
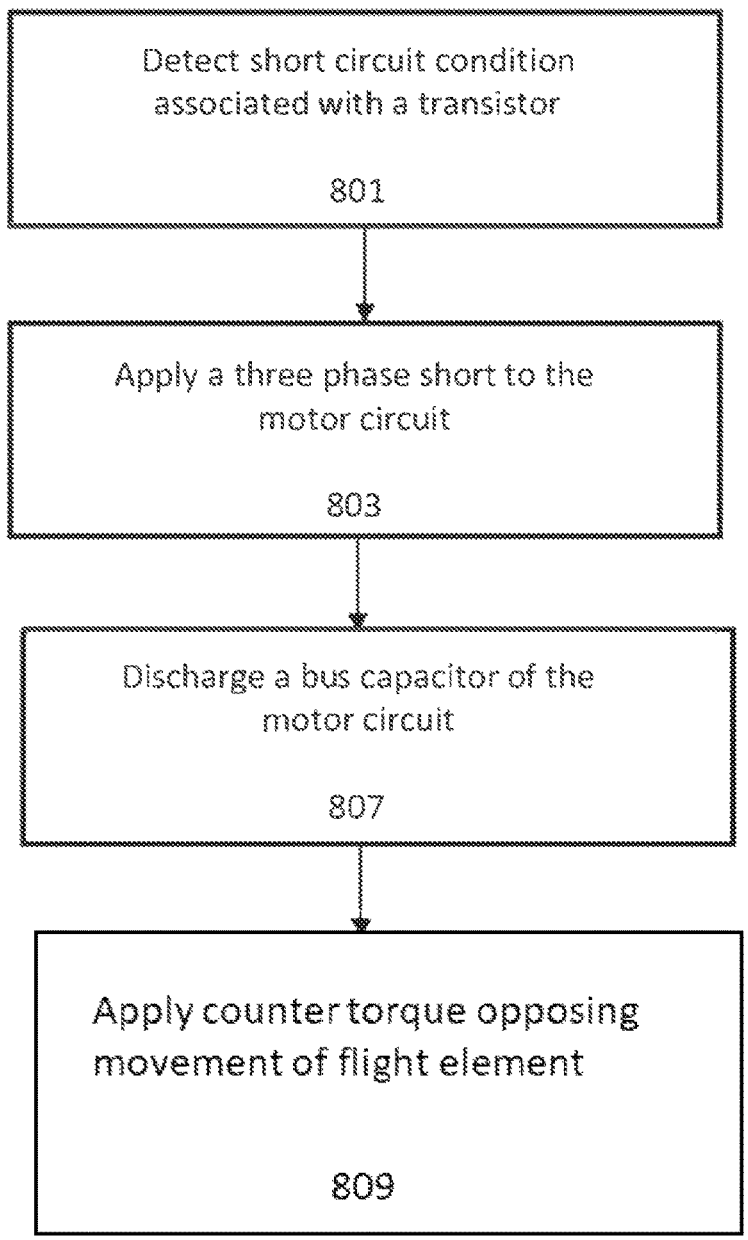
FIG. 8 illustrates a method of mitigating a short-circuit fault, consistent with embodiments of the present disclosure.

FIG. 8 illustrates a method of mitigating a short-circuit fault, consistent with embodiments of the present disclosure. In some embodiments, controller 201 performs the process of FIG. 8, while in other embodiments different device(s) perform one or more steps of the process. At Step 801, controller 201 may detect a short circuit condition through one or more voltage sensing components and/or current sensing components. Further, the voltage sensing components and/or current sensing components may be placed in parallel and/or series with one or more transistors to detect an issue with the respective transistor(s). For example, in some embodiments, controller 201 may detect a short circuit associated with one or more transistors (208a-208c, 209a-209c). In some embodiments, controller 201 and/or a battery management system may disconnect power source 204 (e.g. by opening a switch and/or by blowing a fuse). At Step 803, after detecting the short circuit condition, the controller 201 and/or motor bridge 202 may command the transistors (208a-208c, 209a-209c) to perform a three phase short. For example, the short circuit may be associated with at least one of transistors 209a-209b and the controller 201 may command transistors 208a-208c to apply the three-phase short. Similarly, the short circuit may be associated with at least one of transistors 208a-208b and the controller 201 may command transistors 209a-209c to apply the three-phase short.

At Step 807, the bus capacitor 205 is discharged. For example, in some embodiments, any one of the means of allowing current flow across the brake resistor 206 described above with reference to FIG. 3-FIG. 5 and FIG. 7A-FIG. 7B may be used to allow current to flow across brake resistor 206 and discharge the bulk capacitor 205. In some embodiments, the bulk capacitor 205 may be discharged through a passive discharge resistor separate from the brake resistor 206, as described above with reference to FIG. 7A-FIG. 7B. After beginning discharge of the bulk capacitor 205, the controller 201 may determine that a voltage across the bulk capacitor 205 has dropped below a threshold. In some embodiments, the controller 201 may receive information on the voltage across the bulk capacitor 205 from a different device (e.g. a battery management system) to make this determination. In some embodiments, the controller 201 may directly monitor voltage across the bulk capacitor 205 using one or more voltage sensing devices and/or circuitry. For example, the controller 201 may monitor a bus voltage across the capacitor 205 using a voltage comparator. In some embodiments, the motor circuit may be an inverter circuit (e.g. for a propeller, proprotor, or rotor) and the voltage threshold may be approximately 40V-60V. In some embodiments, the motor circuit may be a DC motor circuit (e.g. for a flight control surface) and the voltage threshold may be lower.

At Step 809, based on determining the voltage across the bulk capacitor 205 has dropped below the threshold, the controller 201 may apply a counter torque opposing the movement of the flight element. The controller 201 may use any means described above with reference to FIG. 3-FIG. 6 and FIG. 7B to provide a counter torque opposing the movement of the flight element. For example, in some embodiments, the controller 201 completely shorts the motor as described with reference to FIG. 6. In some embodiments, the controller 201 allows current through the brake resistor 206, as described with reference to FIGS. 3-5 and 7B. For example, the controller 201 may close all transistors (e.g. 208*a*-208*c* and 209*a*-209*c*) and connect brake resistor 206 circuitry to allow current to flow through the brake resistor 206.

Embodiments of the present disclosure may further be described by the following clauses:

CLAUSES

1. An electrical system for an aircraft, including: a controller; a resistor; a first transistor connected in series to the resistor; wherein the controller is configured to control the first transistor to prevent current flow across terminals of the first transistor and through the resistor when a power source of the aircraft is providing power; and wherein the first transistor is configured to allow current generated by a back EMF (electromotive force) voltage to flow across the terminals of the first transistor and through the resistor when the power source of the aircraft is not providing power, the back EMF voltage being created by movement of a moveable aircraft structure of the aircraft.
2. The electrical system of clause 1, further comprising a second transistor connected in series to the resistor and the first transistor.
3. The electrical system of clause 2, wherein: the controller is configured to control the second transistor to prevent current flow across terminals of the second transistor and through the resistor when the power source of the aircraft is providing power; and the second transistor is configured to allow current generated by the back EMF voltage to flow across the terminals of the second transistor and through the resistor when the power source of the aircraft is not providing power.
4. The electrical system of any one of clauses 1-3, wherein the controller is configured to control the first transistor to prevent current flow across the terminals of the first transistor and through the resistor by providing a voltage to the first transistor.
5. The electrical system of any one of clauses 1-4, wherein the back EMF voltage is created by the movement of a propeller or a flight control surface.
6. The electrical system of any one of clauses 1-5, further comprising a third transistor, a fourth transistor, a fifth transistor, and a sixth transistor configured to control current flow to stator windings of a motor of the aircraft to control the moveable aircraft structure.
7. The electrical system of clause 6, wherein at least one of the third transistor, the fourth transistor, the fifth transistor, or the sixth transistor is configured to allow current flow across terminals of the at least one transistor and through the resistor when the power source of the aircraft is not providing power.
8. The electrical system of clause 7, wherein the at least one transistor is configured to allow the current flow across the terminals of the at least one transistor and through the resistor when the at least one transistor does not receive a voltage.
9. The electrical system of any of clauses 6-8, wherein the moveable aircraft structure comprises a propeller; and wherein the third transistor, the fourth transistor, the fifth transistor, and the sixth transistor are configured to provide a sinusoidal voltage output to the stator windings of the motor of the aircraft to control the propeller.
10. The electrical system of any one of clauses 6-9, further comprising a capacitor; wherein the controller is configured to detect a short circuit condition and control the third transistor, the fourth transistor, the fifth transistor, and the sixth transistor to short all the stator windings; and wherein the capacitor discharges through the resistor when the controller shorts the stator windings.
11. The electrical system of clause 10, wherein the controller is configured to detect when the capacitor is discharged below a threshold; and wherein the controller is configured to allow the current generated by the back EMF (electromotive force) voltage to flow through the resistor upon detecting the capacitor is discharged below the threshold.
12. An aircraft comprising the electrical system of any of clauses 1-11.
13. The aircraft of clause 12, wherein the aircraft is an electric aircraft.
14. An electrical system for an aircraft, including: a controller; a resistor; a relay connected in series to the resistor; wherein the controller is configured to control the relay to prevent current flow across the resistor when a power source of the aircraft is providing power; and wherein the relay is configured to allow current generated by a back EMF (electromotive force) voltage to flow across the resistor when the power source of the aircraft is not providing power, the back EMF voltage being created by movement of a moveable aircraft structure of the aircraft.
15. The electrical system of clause 14, wherein the relay is a single pole double throw relay.
16. The electrical system of clauses 14 or 15, wherein the controller is configured to control the relay to prevent current flow through the resistor by providing a voltage to the relay.
17. The electrical system of any one of clauses 14-16, wherein the back EMF voltage is created by the movement of a propeller or a flight control surface.
18. The electrical system of any one of clauses 14-17, further comprising a third transistor, a fourth transistor, a fifth transistor, and a sixth transistor configured to control current flow to stator windings of a motor of the aircraft to control the moveable aircraft structure.
19. The electrical system of clause 18, wherein at least one of the third transistor, the fourth transistor, the fifth transistor, or the sixth transistor is configured to allow current flow across the terminals of the at least one transistor and through the resistor when the power source of the aircraft is not providing power.
20. The electrical system of clause 19, wherein the at least one transistor is configured to allow the current flow across the terminals of the at least one transistor and through the resistor when the at least one transistor does not receive a voltage.
21. The electrical system of any of clauses 18-20, wherein the moveable aircraft structure comprises a propeller; and wherein the third transistor, the fourth transistor, the fifth transistor, and the sixth transistor are configured to provide a sinusoidal voltage output to the stator windings of the motor of the aircraft to control the propeller.
22. The electrical system of any one of clauses 18-21, further comprising a capacitor; wherein the controller is configured to detect a short circuit condition and control the third transistor, the fourth transistor, the fifth transistor, and the sixth transistor to short all the stator windings; and wherein the capacitor discharges through the resistor when the controller shorts the stator windings.
23. The electrical system of clause 22, wherein the controller is configured to detect when the capacitor is discharged below a threshold; and wherein the controller is configured to allow the current generated by the back EMF (electromotive force) voltage to flow through the resistor upon detecting the capacitor is discharged below the threshold.
24. An aircraft comprising the electrical system of any of clauses 14-23.
25. The aircraft of clause 25, wherein the aircraft is an electric aircraft.
26. An electrical system for an aircraft, including: a controller; a first set of transistors; a second set of transistors; wherein the controller is configured to control the first set of transistors and second set of transistors to create a magnetic field in stator windings of a motor of the aircraft when a power source of the aircraft is providing power; wherein the first set of transistors are configured to prevent current generated by a back EMF (electromotive force) voltage from flowing across terminals of the first set of transistors when the power source of the aircraft is not providing power, the back EMF voltage being created by movement of a moveable aircraft structure; and wherein the second set of transistors are configured to allow current generated by a back EMF voltage to flow across terminals of the second set of transistors when the power source of the aircraft is not providing power.
27. The electrical system of clause 26, wherein the second set of transistors are depletion mode transistors.
28. The electrical system of clauses 26 or 27, wherein the first set of transistors are enhancement mode transistors.
29. The electrical system of any one of clauses 26-28, wherein the first set of transistors are connected in series to the second set of transistors.
30 The electrical system of any one of clauses 26-29, wherein the aircraft structure comprises a propeller or a flight control surface.
31. The electrical system of any one of clauses 26-30, further comprising a third transistor, a fourth transistor, a fifth transistor, and a sixth transistor configured to control current flow to the stator windings to control the moveable aircraft structure.
32. The electrical system of clause 31, wherein at least one of the third transistor, the fourth transistor, the fifth transistor, or the sixth transistor is configured to allow current flow across terminals of the at least one transistor and across a resistor when the power source of the aircraft is not providing power.
33. The electrical system of clause 32, wherein the at least one transistor is configured to allow the current flow across terminals of the at least one transistor and across the resistor when the at least one transistor does not receive a voltage.
34. The electrical system of any of clauses 31-33, wherein the moveable aircraft structure comprises a propeller; and wherein the third transistor, the fourth transistor, the fifth transistor, and the sixth transistor are configured to provide a sinusoidal voltage output to the stator windings of a motor of the aircraft to control the propeller.
35. The electrical system of any one of clauses 31-34, further comprising a capacitor; wherein the controller is configured to detect a short circuit condition and control the third transistor, the fourth transistor, the fifth transistor, and the sixth transistor to short all the stator windings; and wherein the capacitor discharges through the resistor when the controller shorts the stator windings.
36. The electrical system of clause 35, wherein the controller is configured to detect when the capacitor is discharged below a threshold; and wherein the controller is configured to allow the current generated by the back EMF (electromotive force) voltage to flow through the resistor upon detecting the capacitor is discharged below the threshold.
37. An aircraft comprising the electrical system of any of clauses 26-36.
38. The aircraft of clause 37, wherein the aircraft is an electric aircraft.
39. An electrical system for an aircraft, including: a controller; a first resistor; a first transistor connected in series to the first resistor; wherein the first transistor is configured to prevent current flow across terminals of the first transistor and through the first resistor when a power source of the aircraft is providing power; and wherein the first transistor is configured to allow current generated by a back EMF (electromotive force) voltage to flow across terminals of the first transistor and through the first resistor when the power source is not providing power, the back EMF voltage being created by movement of a moveable aircraft structure of the aircraft.
40. The electrical system of clause 39, further comprising a diode and a second resistor.
41. The electrical system of clause 40, wherein the back EMF voltage causes a breakdown voltage threshold of the diode to be exceeded and the diode allows current to flow across terminals of the diode and the second resistor.
42. The electrical system of clause 41, wherein the current flow through the diode and the second resistor causes the first transistor to allow current generated by the back EMF voltage to flow across terminals of the first transistor and through the first resistor.
43. The electrical system of any one of clauses 39-42, further comprising a second transistor, wherein the controller is configured to control the second transistor to allow current to flow terminals of the second transistor and allow a capacitor to be discharged.
44. The electrical system of any one of clauses 39-43, wherein the back EMF voltage is created by the movement of a propeller or a flight control surface.

45. The electrical system of any one of clauses 39-44, further comprising a third transistor, a fourth transistor, a fifth transistor, and a sixth transistor configured to control current flow to stator windings of the motor to control the moveable aircraft structure.
46. The electrical system of clause 45, wherein at least one of the third transistor, the fourth transistor, the fifth transistor, or the sixth transistor is configured to allow current flow terminals of the at least one transistor and through the first resistor when the power source of the aircraft is not providing power.
47. The electrical system of clauses 46, wherein the at least one transistor is configured to allow the current flow across terminals of the at least one transistor and through the first resistor when the at least one transistor does not receive a voltage.
48. The electrical system of any one of clauses 45-47, wherein the moveable aircraft structure comprises a propeller; and wherein the third transistor, the fourth transistor, the fifth transistor, and the sixth transistor are configured to provide a sinusoidal voltage output to the stator windings of the motor to control the propeller.
49. The electrical system of any one of clauses 45-48, further comprising a capacitor; wherein the controller is configured to detect a short circuit condition and control the third transistor, the fourth transistor, the fifth transistor, and the sixth transistor to short all the stator windings; and wherein the capacitor discharges through the second resistor when the controller shorts the stator windings.
50. The electrical system of clause 49, wherein the controller is configured to detect when the capacitor is discharged below a threshold; and wherein the controller is configured to allow the current generated by the back EMF (electromotive force) voltage to flow through the first resistor upon detecting the capacitor is discharged below the threshold.
51. An aircraft comprising the electrical system of any of clauses 39-50.
52. The aircraft of clause 51, wherein the aircraft is an electric aircraft.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the inventions disclosed herein.

The invention claimed is:

1. A motor control system for an aircraft, including:
a controller; and
a first switching device configured to control current flow to coils of a motor,
wherein:
the controller is configured to control a second switching device connected in series to a first resistor to prevent current flow through the first resistor when a power source of the aircraft is providing power;
the second switching device is configured to allow current generated by a back EMF (electromotive force) voltage to flow through the first resistor when the power source of the aircraft is not providing power, the back EMF voltage being created by movement of a moveable aircraft structure of the aircraft; and
the first switching device is configured to allow current flow across it and through the first resistor when the power source of the aircraft is not providing power.
2. The motor control system of claim 1, wherein the second switching device is a first transistor.
3. The motor control system of claim 2, further comprising a second transistor connected in series to the first resistor and the first transistor.
4. The motor control system of claim 3, wherein:
the controller is configured to control the second transistor to prevent current flow across terminals of the second transistor and through the first resistor when the power source of the aircraft is providing power; and
the second transistor is configured to allow current generated by the back EMF voltage to flow across the terminals of the second transistor and through the first resistor when the power source of the aircraft is not providing power.
5. The motor control system of claim 2, wherein the controller is configured to control the first transistor to prevent current flow across terminals of the first transistor and through the first resistor by providing a voltage to the first transistor.
6. The motor control system of claim 2, wherein the back EMF voltage is created by movement of a propeller or a flight control surface.
7. The motor control system of claim 2, further comprising a third transistor, a fourth transistor, a fifth transistor, and a sixth transistor configured to control current flow to the coils of the motor to control the moveable aircraft structure.
8. The motor control system of claim 7, wherein the first switching device comprises at least one of the third transistor, the fourth transistor, the fifth transistor, or the sixth transistor.
9. The motor control system of claim 8, wherein the at least one transistor is configured to allow current flow across terminals of the at least one transistor and through the first resistor when the at least one transistor does not receive a voltage from the controller.
10. The motor control system of claim 8,
wherein the moveable aircraft structure comprises a propeller; and
wherein the third transistor, the fourth transistor, the fifth transistor, and the sixth transistor are configured to provide a sinusoidal voltage output to the coils of the motor to control the propeller.
11. The motor control system of claim 10,
further comprising a capacitor;
wherein the controller is configured to detect a short circuit condition and control the third transistor, the fourth transistor, the fifth transistor, and the sixth transistor to short all the stator windings coils of the motor; and
wherein the capacitor discharges through the first resistor when the controller shorts the coils of the motor.
12. The motor control system of claim 11,
wherein the controller is configured to detect when the capacitor is discharged below a threshold; and
wherein the controller is configured to allow the current generated by the back EMF (electromotive force) voltage to flow through the first resistor upon detecting the capacitor is discharged below the threshold.
13. The motor control system of claim 2, further comprising a diode and a second resistor.

14. The motor control system of claim 13, wherein the back EMF voltage causes a breakdown voltage threshold of the diode to be exceeded and the diode allows current to flow through the second resistor.

15. The motor control system of claim 14, wherein the current flow through the diode and the second resistor causes the first transistor to allow current generated by the back EMF voltage to flow through the first resistor.

16. The motor control system of claim 13, further comprising a second transistor, wherein the controller is configured to control the second transistor to allow current to flow across terminals of the second transistor and allow a capacitor to be discharged.

17. The motor control system of claim 16, further comprising a third transistor, a fourth transistor, a fifth transistor, and a sixth transistor configured to control current flow to to the coils of the motor to control the moveable aircraft structure.

18. The motor control system of claim 17, wherein the first switching device comprises at least one of the third transistor, the fourth transistor, the fifth transistor, or the sixth transistor.

19. The motor control system of claim 17,
wherein the moveable aircraft structure comprises a propeller; and
wherein the third transistor, the fourth transistor, the fifth transistor, and the sixth transistor are configured to provide a sinusoidal voltage output to the coils of the motor to control the propeller.

20. The motor control system of claim 19,
further comprising a capacitor;
wherein the controller is configured to detect a short circuit condition and control the third transistor, the fourth transistor, the fifth transistor, and the sixth transistor to short all the coils of the motor;
wherein the capacitor discharges through the second resistor when the controller shorts the coils of the motor;
wherein the controller is configured to detect when the capacitor is discharged below a threshold; and
wherein the controller is configured to allow the current generated by the back EMF (electromotive force) voltage to flow through the first resistor upon detecting the capacitor is discharged below the threshold.

21. The motor control system of claim 1, wherein the second switching device is a relay.

22. The motor control system of claim 21, wherein the relay is a single pole double throw relay.

23. The motor control system of claim 21, wherein the controller is configured to control the relay to prevent current flow through the first resistor by providing a voltage to the relay.

24. The motor control system of claim 21, wherein the back EMF voltage is created by movement of a propeller or a flight control surface.

25. The motor control system of claim 21, further comprising a third transistor, a fourth transistor, a fifth transistor, and a sixth transistor configured to control current flow to the coils of the motor to control the moveable aircraft structure.

26. The motor control system of claim 25, wherein the first switching device comprises at least one of the third transistor, the fourth transistor, the fifth transistor, or the sixth transistor.

27. The motor control system of claim 26, wherein the at least one transistor is configured to allow the current flow across terminals of the at least one transistor and through the first resistor when the at least one transistor does not receive a voltage from the controller.

28. The motor control system of claim 26,
wherein the moveable aircraft structure comprises a propeller; and
wherein the third transistor, the fourth transistor, the fifth transistor, and the sixth transistor are configured to provide a sinusoidal voltage output to the coils of the motor to control the propeller.

29. The motor control system of claim 28,
further comprising a capacitor;
wherein the controller is configured to detect a short circuit condition and control the third transistor, the fourth transistor, the fifth transistor, and the sixth transistor to short the coils of the motor; and
wherein the capacitor discharges through the first resistor when the controller shorts the coils of the motor.

30. The motor control system of claim 29,
wherein the controller is configured to detect when the capacitor is discharged below a threshold; and
wherein the controller is configured to allow the current generated by the back EMF (electromotive force) voltage to flow through the first resistor upon detecting the capacitor is discharged below the threshold.

31. A motor control system for an aircraft, including:
a controller;
wherein the controller is configured to control a first and second transistor connected in series to a first resistor to prevent current flow through the first resistor when a power source of the aircraft is providing power; and
wherein the first and second transistors are configured to allow current generated by a back EMF (electromotive force) voltage to flow through the first resistor when the power source of the aircraft is not providing power, the back EMF voltage being created by movement of a moveable aircraft structure of the aircraft.

32. A motor control system for an aircraft, including:
a diode and a first resistor; and
a controller configured to control a switching device connected in series to a second resistor to prevent current flow through the second resistor when a power source of the aircraft is providing power;
wherein the switching device is configured to allow current generated by a back EMF (electromotive force) voltage to flow through the second resistor when the power source of the aircraft is not providing power, the back EMF voltage being created by movement of a moveable aircraft structure of the aircraft.

33. A motor control system for an aircraft, including:
a controller;
a first transistor, a second transistor, a third transistor, and a fourth transistor configured to control current flow to coils of a motor,
wherein:
the controller is configured to control a switching device connected in series to a first resistor to prevent current flow through the first resistor when a power source of the aircraft is providing power;
the switching device is configured to allow current generated by a back EMF (electromotive force) voltage to flow through the first resistor when the power source of the aircraft is not providing power, the back EMF voltage being created by movement of a moveable aircraft structure of the aircraft; and
at least one of the first transistor, the second transistor, the third transistor, or the fourth transistor is configured to allow current flow across terminals of the at least one transistor and through the first resistor when the power source of the aircraft is not providing power.

34. A motor control system for an aircraft, including:
a controller; and
at least one transistor configured to control current flow to coils of a motor to control a moveable aircraft structure;
wherein:
the controller is configured to control a switching device connected in series to a first resistor to prevent current flow through the first resistor when a power source of the aircraft is providing power; and
the switching device is configured to allow current generated by a back EMF (electromotive force) voltage to flow through the first resistor when the power source of the aircraft is not providing power, the back EMF voltage being created by movement of the moveable aircraft structure of the aircraft.

35. The motor control system of claim 34, wherein the switching device is a second transistor.

36. The motor control system of claim 35, further comprising a third transistor connected in series to the first resistor and the second transistor.

37. The motor control system of claim 34, wherein the back EMF voltage is created by movement of a propeller or a flight control surface.

38. The motor control system of claim 34, wherein the at least one transistor comprises a first transistor, a second transistor, a third transistor, and a fourth transistor configured to control current flow to the coils of the motor to control the moveable aircraft structure.

39. The motor control system of claim 38, wherein at least one of the first transistor, the second transistor, the third transistor, and the fourth transistor is configured to allow current flow across it and through the first resistor when the power source of the aircraft is not providing power.

40. The motor control system of claim 34,
wherein the controller is configured to detect a short circuit condition and control a first transistor, a second transistor, a third transistor, and a fourth transistor to short all the coils of the motor; and
wherein a capacitor discharges through the first resistor when the controller shorts the coils of the motor.

41. The motor control system of claim 34, wherein the switching device is a relay.

42. The motor control system of claim 34, further comprising a diode and a second resistor.

43. The motor control system of claim 42, wherein the back EMF voltage causes a breakdown voltage threshold of the diode to be exceeded and the diode allows current to flow through the second resistor.

44. A motor control system for a vehicle, including:
a controller; and
a first switching device configured to control current flow to coils of a motor,
wherein:
the controller is configured to control a second switching device connected in series to a first resistor to prevent current flow through the first resistor when a power source of the motor is providing power;
the second switching device is configured to allow current generated by a back EMF (electromotive force) voltage to flow through the first resistor when the power source of the motor is not providing power, the back EMF voltage being created by movement of a moveable structure of the vehicle; and
the first switching device is configured to allow current flow across it and through the first resistor when the power source of the motor is not providing power.

45. A method of controlling a motor of an aircraft, comprising:
controlling, by a controller, a second switching device connected in series to a first resistor to prevent current flow through the first resistor when a power source of the aircraft is providing power;
allowing, by the second switching device, current generated by a back EMF (electromotive force) voltage to flow through the first resistor when the power source of the aircraft is not providing power, the back EMF voltage being created by movement of a moveable aircraft structure of the aircraft; and
allowing, by a first switching device configured to control current flow to coils of the motor, current flow across the second switching device and through the first resistor when the power source of the aircraft is not providing power.

46. The method of claim 45, wherein the second switching device is a first transistor.

47. The method of claim 46, further comprising controlling current flow with a second transistor connected in series to the first resistor and the first transistor.

48. The method of claim 45, wherein the back EMF voltage is created by movement of a propeller or a flight control surface.

49. The method of claim 45, further comprising controlling current flow to the coils of the motor to control the moveable aircraft structure with a third transistor, a fourth transistor, a fifth transistor, and a sixth transistor.

50. The method of claim 49, wherein the first switching device comprises at least one of the third transistor, the fourth transistor, the fifth transistor, or the sixth transistor.

51. The method of claim 45,
wherein the controller is configured to detect a short circuit condition and control a third transistor, a fourth transistor, a fifth transistor, and a sixth transistor to short all the coils of the motor; and
wherein a capacitor discharges through the first resistor when the controller shorts the coils of the motor.

52. The method of claim 45, wherein the second switching device is a relay.

53. The method of claim 45, further comprising controlling current flow with a diode and a second resistor.

54. The method of claim 53, wherein the back EMF voltage causes a breakdown voltage threshold of the diode to be exceeded and the diode allows current to flow through the second resistor.

55. A method of controlling a motor of an aircraft, comprising:
controlling, by at least one transistor, current flow to coils of a motor to control a moveable aircraft structure;
controlling, by a controller, a switching device connected in series to a first resistor to prevent current flow through the first resistor when a power source of the aircraft is providing power; and
allowing, by the switching device, current generated by a back EMF (electromotive force) voltage to flow through the first resistor when the power source of the aircraft is not providing power, the back EMF voltage being created by movement of a moveable aircraft structure of the aircraft.

56. The method of claim 55, wherein the switching device is a second transistor.

57. The method of claim 56, further comprising controlling current with a third transistor connected in series to the first resistor and the second transistor.

58. The method of claim 55, wherein the back EMF voltage is created by movement of a propeller or a flight control surface.

59. The method of claim 55, wherein the at least one transistor comprises a first transistor, a second transistor, a third transistor, and a fourth transistor configured to control current flow to the coils of the motor to control the moveable aircraft structure.

60. The method of claim 59, wherein at least one of the first transistor, the second transistor, the third transistor, and the fourth transistor allows current flow across it and through the first resistor when the power source of the aircraft is not providing power.

61. The method of claim 55,
wherein the controller is configured to detect a short circuit condition and control a first transistor, a second transistor, a third transistor, and a fourth transistor to short all the coils of the motor; and
wherein a capacitor discharges through the first resistor when the controller shorts the coils of the motor.

62. The method of claim 55, wherein the switching device is a relay.

63. The method of claim 55, further comprising controlling current with a diode and a second resistor.

64. The method of claim 63, wherein the back EMF voltage causes a breakdown voltage threshold of the diode to be exceeded and the diode allows current to flow through the second resistor.

65. An aircraft, comprising:
a controller;
a first switching device configured to control current flow to coils of a motor of the aircraft; and
a moveable aircraft structure;
wherein:
the controller is configured to control a second switching device connected in series to a first resistor to prevent current flow through the first resistor when a power source of the aircraft is providing power;
the second switching device is configured to allow current generated by a back EMF (electromotive force) voltage to flow through the first resistor when the power source of the aircraft is not providing power, the back EMF voltage being created by movement of the moveable aircraft structure of the aircraft; and
the first switching device is configured to allow current flow across it and through the first resistor when the power source of the aircraft is not providing power.

66. The aircraft of claim 65, wherein the second switching device is a first transistor.

67. The aircraft of claim 66, further comprising a second transistor connected in series to the first resistor and the first transistor.

68. The aircraft of claim 65, wherein the back EMF voltage is created by movement of a propeller or a flight control surface.

69. The aircraft of claim 65, further comprising a third transistor, a fourth transistor, a fifth transistor, and a sixth transistor configured to control current flow to the coils of the motor to control the moveable aircraft structure.

70. The aircraft of claim 69, wherein the first switching device comprises at least one of the third transistor, the fourth transistor, the fifth transistor, or the sixth transistor.

71. The aircraft of claim 70,
wherein the controller is configured to detect a short circuit condition and control a third transistor, a fourth transistor, a fifth transistor, and a sixth transistor to short all the coils of the motor; and
wherein a capacitor discharges through the first resistor when the controller shorts the coils of the motor.

72. The aircraft of claim 65, wherein the second switching device is a relay.

73. The aircraft of claim 65, further comprising a diode and a second resistor.

74. The aircraft of claim 73, wherein the back EMF voltage causes a breakdown voltage threshold of the diode to be exceeded and the diode allows current to flow through the second resistor.

75. An aircraft, comprising:
a controller;
a moveable aircraft structure; and
at least one transistor configured to control current flow to coils of a motor to control the moveable aircraft structure;
wherein:
the controller is configured to control a switching device connected in series to a first resistor to prevent current flow through the first resistor when a power source of the aircraft is providing power, and
the switching device is configured to allow current generated by a back EMF (electromotive force) voltage to flow through the first resistor when the power source of the aircraft is not providing power, the back EMF voltage being created by movement of the moveable aircraft structure of the aircraft.

* * * * *